United States Patent [19]
Callon

[11] Patent Number: 5,247,524
[45] Date of Patent: Sep. 21, 1993

[54] METHOD FOR GENERATING A CHECKSUM

[75] Inventor: Ross Callon, Bedford, Mass.

[73] Assignee: Digital Equipment Corporation, Maynard, Mass.

[21] Appl. No.: 546,012

[22] Filed: Jun. 29, 1990

[51] Int. Cl.$^5$ .............................................. G06F 11/10
[52] U.S. Cl. ........................................ 371/53; 371/54
[58] Field of Search ................................ 371/53, 54

[56] References Cited

U.S. PATENT DOCUMENTS

| | | | |
|---|---|---|---|
| 3,137,788 | 6/1964 | Froggatt | 371/54 |
| 3,460,117 | 8/1969 | Cohn et al. | 371/54 |
| 3,778,765 | 12/1973 | Kanter | 371/53 |
| 3,913,067 | 10/1975 | Goldberg | 371/53 |
| 4,142,243 | 2/1979 | Bishop et al. | 364/900 |
| 4,329,572 | 5/1982 | Lovrich et al. | 371/53 |
| 4,390,989 | 6/1983 | Pehrson | 371/22 |
| 4,715,045 | 12/1987 | Lewis et al. | 375/58 |
| 4,849,978 | 7/1989 | Dishon et al. | 371/51 |
| 4,868,824 | 9/1989 | Golden | 371/53 |

FOREIGN PATENT DOCUMENTS 752340 7/1980 U.S.S.R. .............................. 371/54

OTHER PUBLICATIONS

R. C. Montgomery, Simple Hardware Approach to Error Detection and Correction, Computer Design, Nov. 1978, pp. 109-118.

R. Braden, "Computing The Internet Checksum", Apr. 1989, *Computer Communication Review*, vol. 19, No. 2, pp. 86-94.

C. F. Page, "Checking in Data Processing," Instruments & Control Systems, vol. 37, pp. 129-131, 1964.

Beach, "High Speed Networking Using TP4", IETF, Standford University, 1989.

ANSI ISO/TC97/SC6, ISO 8473: Information Processing Systems . . . Underlying Service assumed by ISO 8473. Mar., 1987.

John Fletcher, "An Arithmetic Checksum for Serial Transmissions," IEEE Transactions on Communications, vol. COM-30 No. 1, pp. 247-252, Jan., 1982.

Keith Skiower, "Improving the Efficiency of the OSI Checksum Calculation," Anastase Nakassis, Fletcher's Error Detection Algorithm: How to Implement it efficiently and how to avoid the most common pitfalls.

Nirmal Saxena, "Extended Precision Checksums," IEEE International Symposium on Fault-Tolerant Computing, 1971; pp. 142-147.

Betty Salzberg, "A Modification of Fletcher's Checksum," IEEE Transactions on Communications, vol. Com-31. No. 2, pp. 295-296, Feb., 1983.

Alistair Cockburn, "Efficient Implementation of the OSI Transport-Protocol Checksum Algorithm Using 8/16-Bit Arithmetic," pp. 2-8, Apr. 13, 1987.

*Primary Examiner*—Charles E. Atkinson
*Attorney, Agent, or Firm*—Fish & Richardson

[57] ABSTRACT

A checksum is generated for a bit string in an information packet to be transmitted across a network, by grouping contiguous bit groups in the bit string and, in sequence, processing each of the bit groups to produce a checksum component for each bit group, with the final checksum for the bit string being produced as an accumulation of the checksum components.

31 Claims, 16 Drawing Sheets

OCTET: _ _ _ _ _ _ _ _

BIT POSITION: 8 7 6 5 4 3 2 1

BIT POSITION: $2^7 2^6 2^5 2^4 2^3 2^2 2^1 2^0$
VALUE

FIG. 1A
(PRIOR ART)

EXAMPLE OCTET: 1 0 1 1 0 1 0 1 = $(1 \times 2^7)$
$+ (1 \times 2^5)$
$+ (1 \times 2^4)$
$+ (1 \times 2^2)$
$+ (1 \times 2^0)$
―――――――
181 = OCTET VALUE

FIG. 1B
(PRIOR ART)

CHECKSUM SCOPE : L OCTETS

OCTET POSITION: 1 2 3 4 5 · · · · L

FIG. 1C
(PRIOR ART)

OCTET EVALUATION

BIT POSITIONS
IN           : ...0 1 1 0 1 0 1 0 1 1 0 1 0 1 0 1 1 1 0 1 0 1 1...
BIT STRING
                              | $i^{th}$ OCTET |

OCTET
BIT POSITION : 1 0 1 1 0 1 0 1
VALUE ASSIGNMENT  $2^7 2^6 2^5 2^4 2^3 2^2 2^1 2^0$

OCTET VALUE $O_i$: 181

$M=5$ OCTETS IN FIELD $j$, $p=2$

OCTET VALUE: $\quad \dfrac{O_{1j}}{1} \quad \dfrac{O_{2j}}{2} \quad \dfrac{O_{3j}}{3} \quad \dfrac{O_{4j}}{4} \quad \dfrac{O_{5j}}{5}$

OCTET NUMBER:

*FIG. 8A*

INNER LOOP REPETITION $i=0$:
$D_1(i=0) = \dfrac{O_{1j}}{(1 \times O_{1j})} + \dfrac{O_{3j}}{(1 \times O_{3j})} + \dfrac{O_{5j}}{(1 \times O_{5j})}$

*FIG. 8B*

$i=1$:
$D_1(i=1) = D_1(i=0) + \dfrac{O_{3j}}{(2 \times O_{3j})} + \dfrac{O_{4j}}{(2 \times O_{4j})}$

*FIG. 8C*

$i=2$:
$D_1(i=2) = D_1(i=1) + \dfrac{O_{1j}}{(4 \times O_{1j})} + \dfrac{O_{2j}}{(4 \times O_{2j})}$

*FIG. 8D*

$D_1(i=2) = (5 \times O_{1j}) + (4 \times O_{2j}) + (3 \times O_{3j}) + (2 \times O_{4j}) + (1 \times O_{5j})$

| | DECIMAL VALUE |
|---|---|
| (307) = | 52/255 |
| (310) = | 55/255 |
| (362) = | 107/255 |

BIT POSITION NUMBER: 16 15 14 13 12 11 10 9 8 7 6 5 4 3 2 1
BIT POSITION VALUE: $2^7\ 2^6\ 2^5\ 2^4\ 2^3\ 2^2\ 2^1\ 2^0\ 2^7\ 2^6\ 2^5\ 2^4\ 2^3\ 2^2\ 2^1\ 2^0$ MOD 255

NEW COMPONENT: 1 1 0 1 1 0 1 0 0 1 0 1 1 0 0 1
REGISTER A: 1 0 1 1 0 0 1 0
+
CARRY: 1 ← 0 1 1 1 1 1 0 1 1 1 0 1 0 1 1
REGISTER A: 0 1 1 1 1 1 1 0 1 1 0 1 1 0 0

| | DECIMAL VALUE |
|---|---|
| (307) = | 52/255 |
| (310) = | 55/255 |
| (362) = | 107/255 |

BIT POSITION NUMBER: 24 23 22 21 20 19 18 17 16 15 14 13 12 11 10 9 8 7 6 5 4 3 2 1
BIT POSITION VALUE: $2^7\ 2^6\ 2^5\ 2^4\ 2^3\ 2^2\ 2^1\ 2^0\ 2^7\ 2^6\ 2^5\ 2^4\ 2^3\ 2^2\ 2^1\ 2^0\ 2^7\ 2^6\ 2^5\ 2^4\ 2^3\ 2^2\ 2^1\ 2^0$ MOD 255

NEW COMPONENT: 1 1 0 1 1 0 1 0 0 1 0 1 1 0 0 1
REGISTER B: 0 0 0 0 0 0 0 0 0 1 0 0 1 0 0 1 0 0 1 0 0 1 0
+
CARRY →
REGISTER B: 0 0 0 0 0 0 0 0 1 0 1 1 1 1 1 1 1 0 1 1 0 1 1

METHOD FOR GENERATING A CHECKSUM

BACKGROUND OF THE INVENTION

This invention relates to checksum generation.

Checksum generation is useful, for example, in communication among processors interconnected in a network. In a typical network, a packet of information containing, for example, a binary-encoded bit string of control information and data, may be transmitted from an originating processor to a destination processor directly, or through one or more intermediate processors. During transmission, errors may be introduced into the information packet by, for example, spurious network noise. Processing of an erroneous packet by an intermediate or destination processor may cause that processor to reject, or "lose", the packet, and may also cause the processor to fail.

To guard against such lost packets and failures, error-checking mechanisms may be used to verify the correctness of bits received at a processor, allowing erroneous information packets to be discarded before causing faulty processing to occur. A checking mechanism could involve, for example, generating an arithmetic quantity based on some of the bits to be sent from an originating processor, including the arithmetic quantity in the packet when the packet is transmitted, and then verifying the quantity when the packet is received by an intermediate or destination processor.

One such error-checking mechanism is a so-called arithmetic checksum, defined by the International Organization for Standardization (ISO) in ISO/TC 97/SC 6-ISO 8473: "Information Processing Systems—Data Communications—Protocol for Providing the Connectionless-mode Network Service", with its Addendum 1: "Provision of the Underlying Service assumed by the ISO 8473," March, 1987, incorporated herein by reference. The ISO checksum is required as part of the standard communications protocol for any network subscribing to the ISO network configuration.

Referring to FIG. 1A, the ISO protocol for error-checking an information packet is based on grouping bits of the packet into eight-bit groups, or octets. The eight bit positions in an octet are numbered 1 through 8 from right to left. The value of a given bit that appears as a "1" is then taken to be $2^{p-1}$, where p is the bit position. For example, $2^0$ ($=1$) is the value for the first (least significant) bit position, and $2^7$ ($=128$) is the value for the eighth (most significant) bit position. An octet is then taken to have a so-called octet value that is equal to the sum of the bit position values of "1" bits. As shown in FIG. 1B, an octet having, for example, the bits 10110101 is said to have an octet value of 181 base 10.

Following the ISO network protocol, a checksum is generated with regard to an information packet whenever that packet is transmitted or received. The checksum may be generated using all of the bits in the packet, or alternatively, only a segment of the packet's bits. In either case, the string of bits that is used in the checksum generation is called the checksum scope. As shown in FIG. 1C, the checksum scope is specified to include some number, L, of octets. These L octets are numbered from 1 to L, with octet 1 [L] being that octet in the checksum scope which is first [last] submitted to the network during an information packet transmittal.

When a processor, e.g., an originating or destination processor, in an ISO network generates a checksum for an information packet's checksum scope, the processor processes, in sequence, the L octets of the checksum scope bit string to produce a checksum value. This generation technique follows a checksum algorithm as defined by J. G. Fletcher in "An Arithmetic Checksum for Serial Transmission," IEEE Trans. Comm., Vol. Com30, No. 1, 1982.

Referring to FIG. 1D, the $i^{th}$ octet in a checksum scope is assembled by a processor from eight contiguous bits in the bit string. The processor then assigns the bit position values of $2^0$, $2^1$, $2^2$, $2^3$, $2^4$, $2^5$, $2^6$, and $2^7$ to the corresponding bits in the octet, starting from the rightmost (least significant) bit, respectively. With this bit position assignment, the octet is given an octet value $O_i$ that is the sum of the bit position values assigned to all of the octet bits which are a "1", giving an octet value $O_i$ equal to 181 base 10 for the example sequence.

The octet values $O_i$ ($i=1$ to L) in a checksum scope, are used by a processor to generate a checksum, each octet value being used as soon as it is generated. The checksum comprises two checksum variables, $C_0$ and $C_1$, which are each a function of the checksum scope's octet values. When a processor begins evaluation of a checksum scope, both variables $C_0$ and $C_1$ are set equal to zero, and then iteratively updated as each octet value $O_i$ in the checksum scope is determined, as follows:

For i = 1 to L:  $C_0(i) = [C_0(i-1) + O_i]$ mod 255 and $C_1(i) = [C_1(i-1) + C_0(i)]$ mod 255.

where "mod 255" indicates modulo arithmetic base 255. Using this iterative process, once the L octets in the checksum scope have been evaluated, $C_0(i=L)$ is equal to the arithmetic sum, mod 255, of the octet values in the checksum scope, and $C_1(i=L)$ is equal to the weighted arithmetic sum, mod 255, of the octet values in the checksum scope, i.e., the sum of $(1 \times O_L) + (2 \times O_{L-1}) + \ldots + (L \times O_1)$, mod 255.

Thus, referring to FIG. 2A, a pictorial representation of the arithmetic sum comprising the final value of $C_0(i=L)$ includes one octet value block for each octet in the checksum scope. Similarly, a pictorial representation of the weighted arithmetic sum comprising the final value of $C_1(i=L)$, as shown in FIG. 2B, includes one octet value block for the last octet in the checksum scope, and an increasing number of octet value blocks for each of the preceding octets, with the first octet contributing L octet value blocks to the value of $C_1(i=L)$.

A processor "builds" this stair-cased triangular representation for the value of $C_1(i=L)$, as well as the rectangular representation for the value of $C_0(i=L)$, using the iterative relationship discussed above; each iteration of the relationship adds a number of octet value blocks to the triangle and rectangle in the following way. Referring to FIG. 2C, after a processor executes the iterative relationship once, both $C_1$ and $C_0$ include one block for the first octet's value, $O_1$. A second execution of the relationship adds one block to $C_0$ for the second octet's value, as shown in FIG. 2D, and to $C_1$ adds one additional block for the first octet's value and one block for the second octet's value, $O_2$. Similarly, a third execution of the relationship adds, as shown in FIG. 2E, one block to $C_0$ for the third octet's value, and to $C_1$ adds a third block for the first octet's value, a second octet for the second octet's value, and one block for the third octet's value, $O_3$.

After executing the iterative process a number, L, of times, the processor has "built" the $C_0(i=L)$ rectangle to include L octet value blocks, and has "built" the $C_1(i=L)$ triangle to include L octet value blocks for the first octet and a corresponding number of blocks for the other octets, with the Lth octet contributing one block. If, for example, there are L=9 octets in the checksum scope, then, as shown in FIG. 2F, the $C_1(i-9)$ staircased triangle is 9 blocks long and 9 blocks deep, and the $C_0(i=9)$ rectangle is 9 blocks long.

Before transmitting an information packet for which a checksum has been generated, an originating processor in an ISO network may further process the packet to reflect the values of the checksum variables $C_0(i=L)$ and $C_1(i=L)$. For example, additional octets may be appended to the checksum scope so that recalculation of the two checksum variables $C_0(i=L)$ and $C_1(i=L)$ for the new checksum scope would produce a value of zero for both variables.

When an intermediate or destination processor in an ISO network receives an information packet for which a checksum has been generated, it regenerates a checksum for the information packet's checksum scope to verify the correctness of the packet. Each of the octets in the checksum scope is evaluated, in sequence, by the processor to generate values for the checksum variables $C_0(i=L)$ and $C_1(i=L)$ with the relationships given above. If, after processing every octet in the checksum scope, the final values of both checksum variables $C_0(i=L)$ and $C_1(i=L)$ are equal to zero, the processor is assured with a high probability that it has received a correct information packet. Any nonzero final value for one or both of the regenerated checksum variables indicates that the received information packet is erroneous and therefore should not be processed.

SUMMARY OF THE INVENTION

In general, in one aspect, the invention features a method for assigning a value to a bit string having a number, N, of bits, the number N being an integral multiple of a number, q. The method includes assigning to each bit position i (i=1, 2, ..., N, starting with the right-most bit) in the bit string a bit position value equal to $(2^{i-1}) \bmod (2^q-1)$; and assigning to the bit string the value of the sum, mod $(2^q-1)$, of the bit position values of all of the bits in the bit string that contain a "1".

Preferred embodiments include the following features. The method includes storing the bit string, itself representing the value of the sum, in a hardware register that is a number, R, of bits-long, the value of R being no less than the value of N.

In general, in another aspect, the invention features a method for determining a value of such a bit by assigning a bit position value as above, and adding together, mod $(2^q-1)$, the bit position values of all of the bits in the bit string that contain a "1", storing the addition result in such a hardware, and adding any carry bit that is generated by the addition of the bit in the $q^{th}$ bit position to the bit in the first bit position, the addition result representing the value of the bit string.

Preferred embodiments include the following features. q is equal to 8, or 16, or 32, or 64.

In general, in another aspect, the invention features a method for determining the sum, mod $(2^q-1)$, of the values of a number, M, of contiguous q bit-long bit groups which together form a bit string having a number, N, of bits, each q bit-long bit group comprising q successive bits which are each in a bit position p (p=1, 2, ..., q, starting with the right-most bit in a given q bit-long bit group) having a bit position value equal to $2^{p-1}$, the value of a q bit-long bit group being the sum of the bit position values of all of the bits in that q bit-long bit group that contain a "1". The method includes assigning bit position values as before, whereby the assigned bit position values designate each of the M q bit-long bit groups in the bit string, adding, mod $(2^q-1)$, the bit position values of all of the bits in the bit string that contain a "1", and storing the addition result in such a hardware register. The addition result representing the sum, mod $(2^q-1)$, of the values of the M q bit-long bit groups.

In general, in another aspect, the invention features a method for determining the sum, mod $(2^q-1)$, of the values of a number, F, of contiguous q bit-long bit groups which together form a bit string having a number, N, of bits, each q bit-long group comprising q successive bits which are each in a bit position p (p=1, 2, ..., q, starting with the right-most bit in a given q bit-long bit group) having a bit position value equal to $2^{p-1}$, the value of a q-bit long bit group being the sum of the bit position values of all of the bits in that q bit-long bit group that contain a "1". The method includes, in sequence, assembling successive bit groups of a number, L, of bits, each L bit-long bit group comprising M contiguous groups each of q bits; assigning bit position values as before whereby the assigned bit position values in a given L bit-long group designate each of the M q bit-long bit groups in that L bit-long bit group; adding, mod $(2^q-1)$, the bit position values of all of the bits in a given L bit-long bit group that contain a "1", to produce a first addition result for each of the L bit-long bit groups; storing each of the first addition results in a hardware register that is a number, R, of bits-long, the value of R being no less than the value of L, each first addition result representing the sum, mod $(2^q-1)$, of the values of each of the M q bit-long bit groups in a given L bit-long group; adding, mod $(2^q-1)$, the first addition results to produce a second addition result; and storing the second addition result in a hardware register that is a number, R, of bits-long, the value of R being no less than the value of L, the second addition result representing the sum, mod $(2^q-1)$, of the values of the number, F, of q bit-long groups in the bit string.

In preferred embodiments, q is 8 and R is 32 or q is 8 and R is 64; M may be 2 or 4 or 6 or 8.

In general, in another aspect, the invention features a method for adding, mod $(2^q-1)$, the bits of a first bit string with the bits of a second bit string, the first and second bit strings each having a number, N, of bits, the number N being a multiple of a number, q. The method includes assigning to each bit position i (i=1, 2, ..., N, starting with the right-most bit) in each of the bit strings a bit position value equal to $(2^{i-1}) \bmod (2^q-1)$; adding, mod $(2^q-1)$, each bit in the first bit string with that bit in the second bit string having the same bit position i as a given bit in the first bit string; adding, mod $(2^q-1)$, any carry bit generated by the addition of the bit in the $i^{th}$ bit position of the first bit string with the bit in the $i^{th}$ bit position of the second bit string, i being less than the number, N, of bits in each of the two bit strings, to the bit in the $(i+1)^{th}$ bit position of the second bit string; and adding, mod $(2^q-1)$, any carry bit generated by the addition of the bit in the $N^{th}$ bit position of the first bit string with the bit in the $N^{th}$ bit position of the second bit string to the bit in the first bit position of the second bit string.

In general, in another aspect, the invention features a method for adding, mod $(2^q-1)$, the bits of a first bit string to the bits of a second bit string, the first bit string having a number, M, of bits and the second bit string having a number, N, of bits, the numbers M and N being a multiple of a number, q, the number N being less than the number M such that the first bit string includes a number, M-N, of more significant bits than the second bit string. The method includes assigning to each bit position i (i=1, 2, ..., M, starting with the right-most bit) in the first bit string a bit position value equal to $(2^{i-1})$ mod $(2^q-1)$; assigning to each bit position i (i=1, 2, ..., N, starting with the right-most bit) in the second bit string a bit position value equal to $(2^{i-1})$ mod $(2^q-1)$; adding, mod $(2^q-1)$, each bit from the first bit string to that bit in the second bit string having the same bit position i as a given bit in the first bit string; adding, mod $(2^q-1)$, any carry bit generated by the addition of the bit in the $i^{th}$ bit position of the first bit string with the bit in the $i^{th}$ bit position of the second bit string, i being less than the number, N of bits in the second bit string, to the bit in the $(i+1)^{th}$ bit position of the first bit string; and adding, mod $(2^q-1)$, any carry bit generated by the addition of the bit in the $N^{th}$ bit position of the second bit string with the corresponding bit in the $i^{th}$ bit position of the first bit string to the bit in the $i=(N+1)^{th}$ bit position of the first bit string, with any carry bit generated by this addition being added to the bit in the next more significant bit position of the first bit string.

In general, in another aspect, the invention features a method for adding, mod $(2^q1)$, the bits of a first bit string to the bits of a second bit string, the first and second bit strings each having a number, N, of bits, the number N being a multiple of a number, q. The method includes assigning to each bit position i (i=1, 2, ..., N, starting with the right-most bit) in each of the bit strings a it position value equal to $(2^{i-1})$ mod $(2^q-1)$; 1); adding, mod $(2^q-1)$, each bit in the first bit string with that bit in the second bit string having the same bit position i as a given bit in the first bit string; adding, mod $(2^q-1)$, any carry bit generated by the addition of the bit in the $i^{th}$ bit position of the first bit string with the bit in the $i^{th}$ bit position of the second bit string, i being not equal to an integral of the number q, to the $(i+1)^{th}$ bit position of the second bit string; and adding, mod $(2^q-1)$, any carry bit generated by the addition of the bit in the $i^{th}$ bit position of the first bit string with the bit in the $i^{th}$ bit position of the second bit string, i being equal to an integral of the number q, to the next least significant bit that has a bit position value equal to 1.

The invention also includes other features set forth in the claims.

Other advantages and features will become apparent from the following description of the preferred embodiments and from the claims.

DESCRIPTION OF THE PREFERRED EMBODIMENT

We firstly briefly describe the drawings.

FIG. 1A is a diagram illustrating the bit positions and bit position values of an octet.

FIG. 1B presents the computation of the octet value of an example octet.

FIG. 1C is a diagram illustrating the octet positions in a checksum scope.

FIG. 1D presents the computation of the octet value of an example octet within an example checksum scope.

FIGS. 2C-2E are diagrams of pictorial representations of the checksum variables $C_0$ and $C_1$ after a first, second, and third iteration, respectively, of the ISO standard checksum generation technique.

FIG. 2F is a diagram illustrating a pictorial representation of the checksum variable $C_1$ and a pictorial representation of the checksum variable $C_0$ after completing the ISO standard checksum generation technique for an example checksum scope consisting of nine octets.

Figures 3, 4:
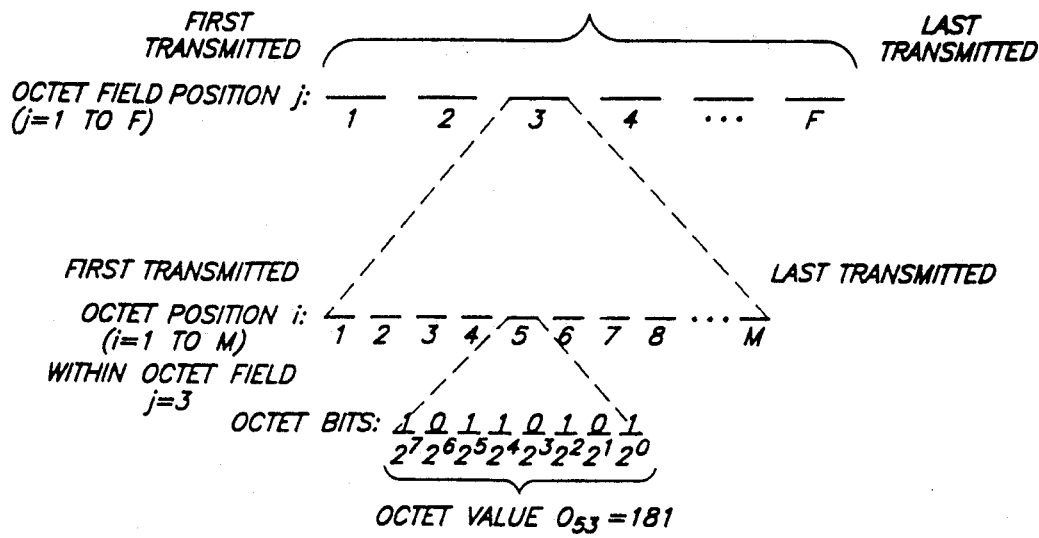
FIG. 3 is a diagram illustrating the octet positions in a checksum scope to be processed by the checksum generation technique of the invention and also illustrating the process of computing the octet value of an example octet in the checksum scope.

FIG. 4 presents the computation of the octet field value of an example octet field in a checksum scope to be processed by the checksum generation technique of the invention.

Figure 5:
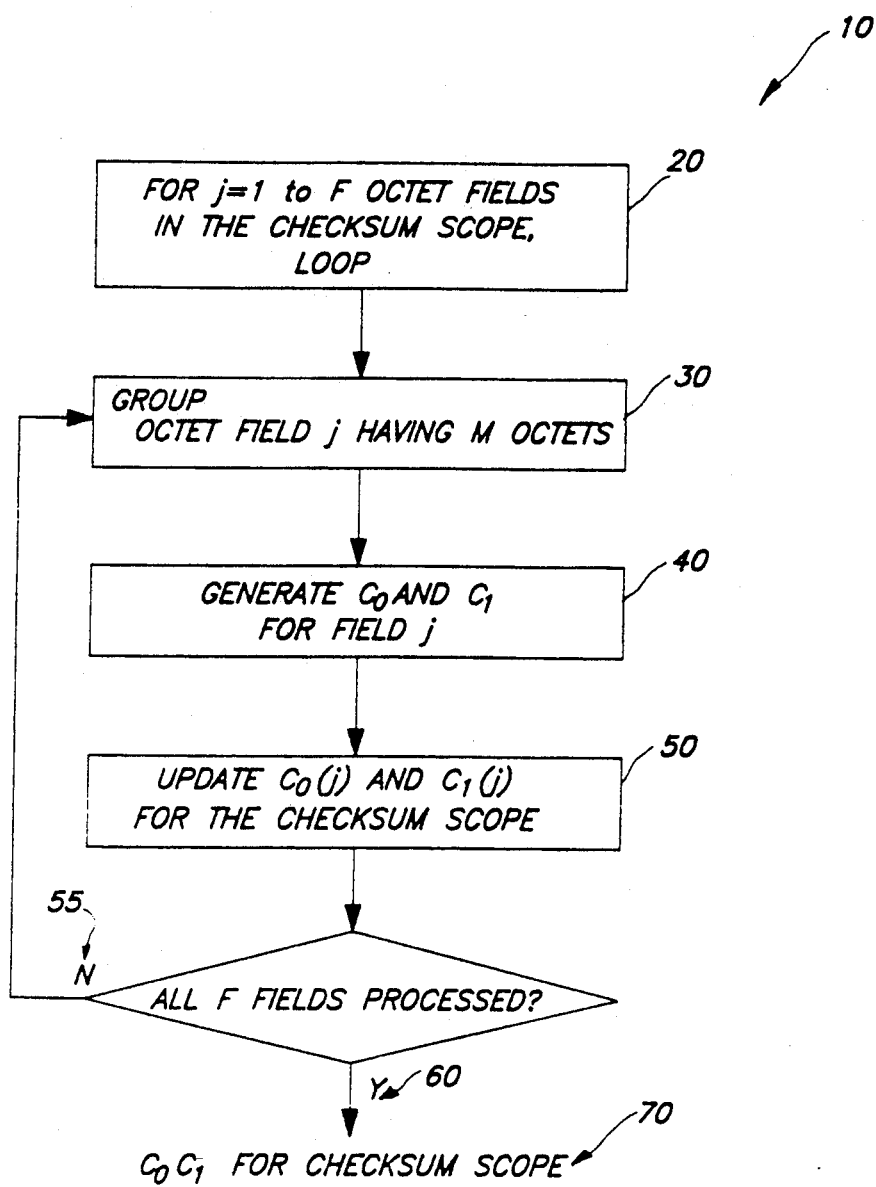

FIG. 5 is a flow diagram of the checksum generation technique of the invention.

Figure 6A:
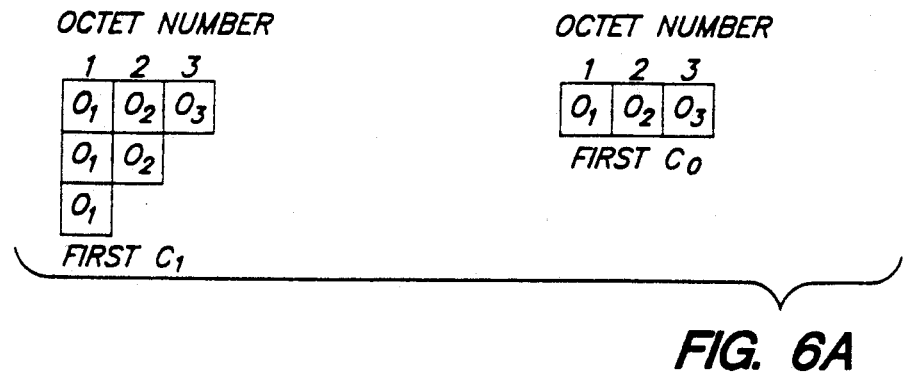
Figure 6B:
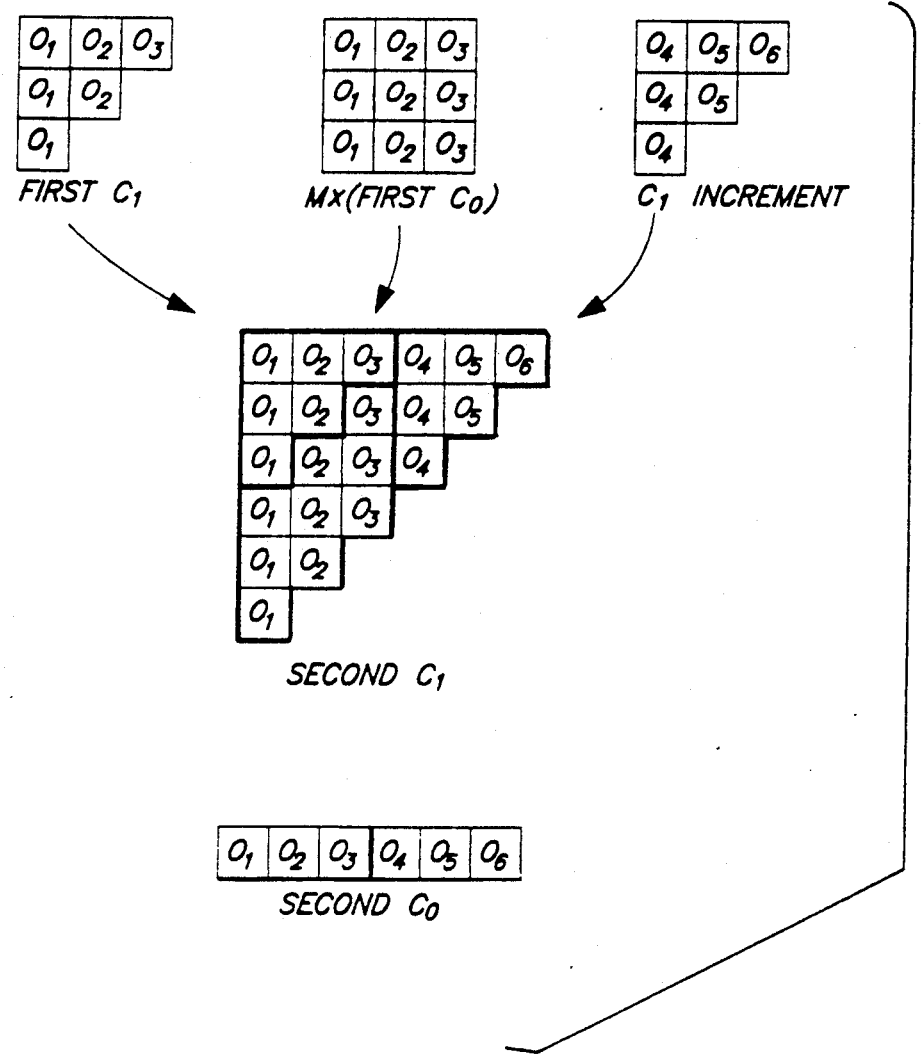
Figure 6C:
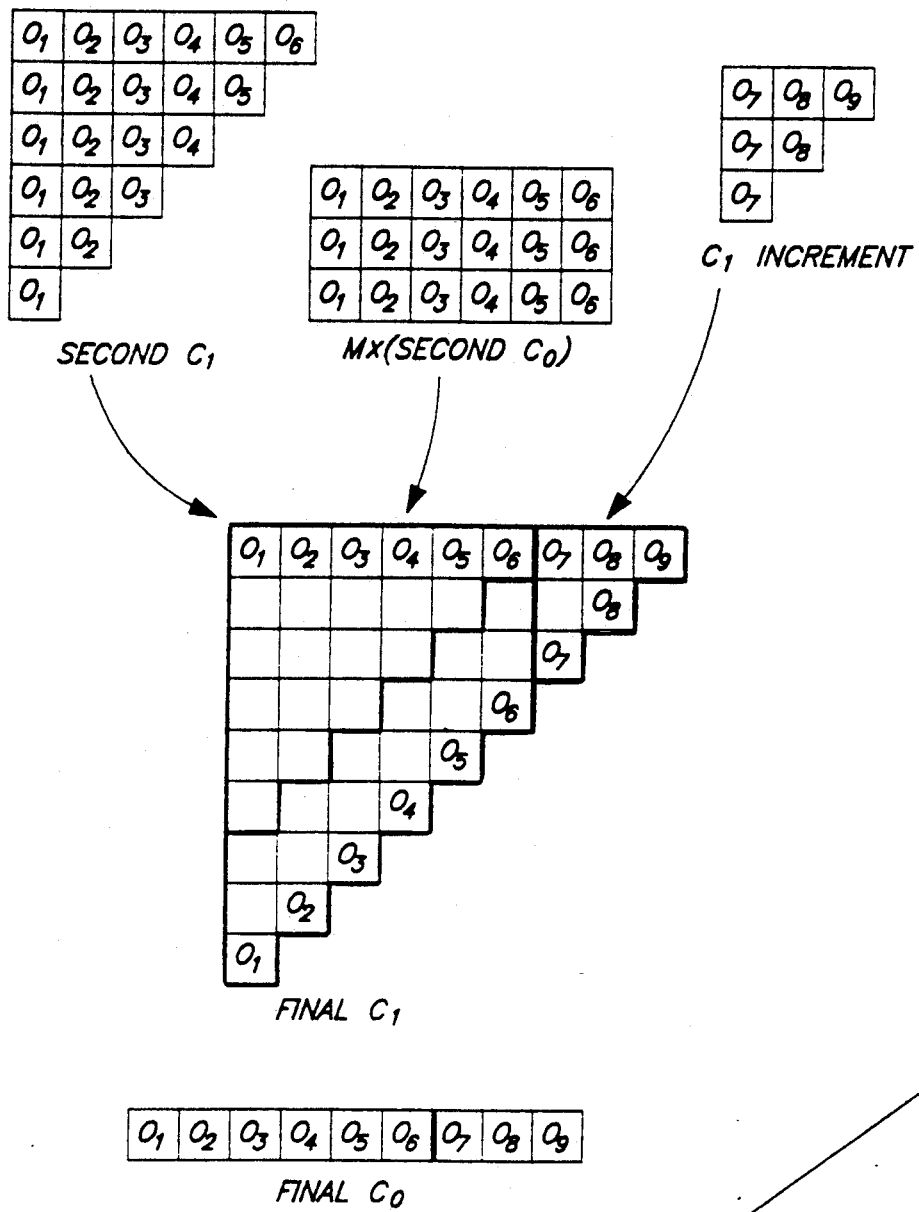

FIGS. 6A-6C are diagrams illustrating pictorial representations of the checksum variables $C_0$ and $C_1$ as they are produced after a first, second, and third process loop, respectively, of the checksum generation technique of FIG. 5, using an example checksum scope including nine octets.

Figure 7:
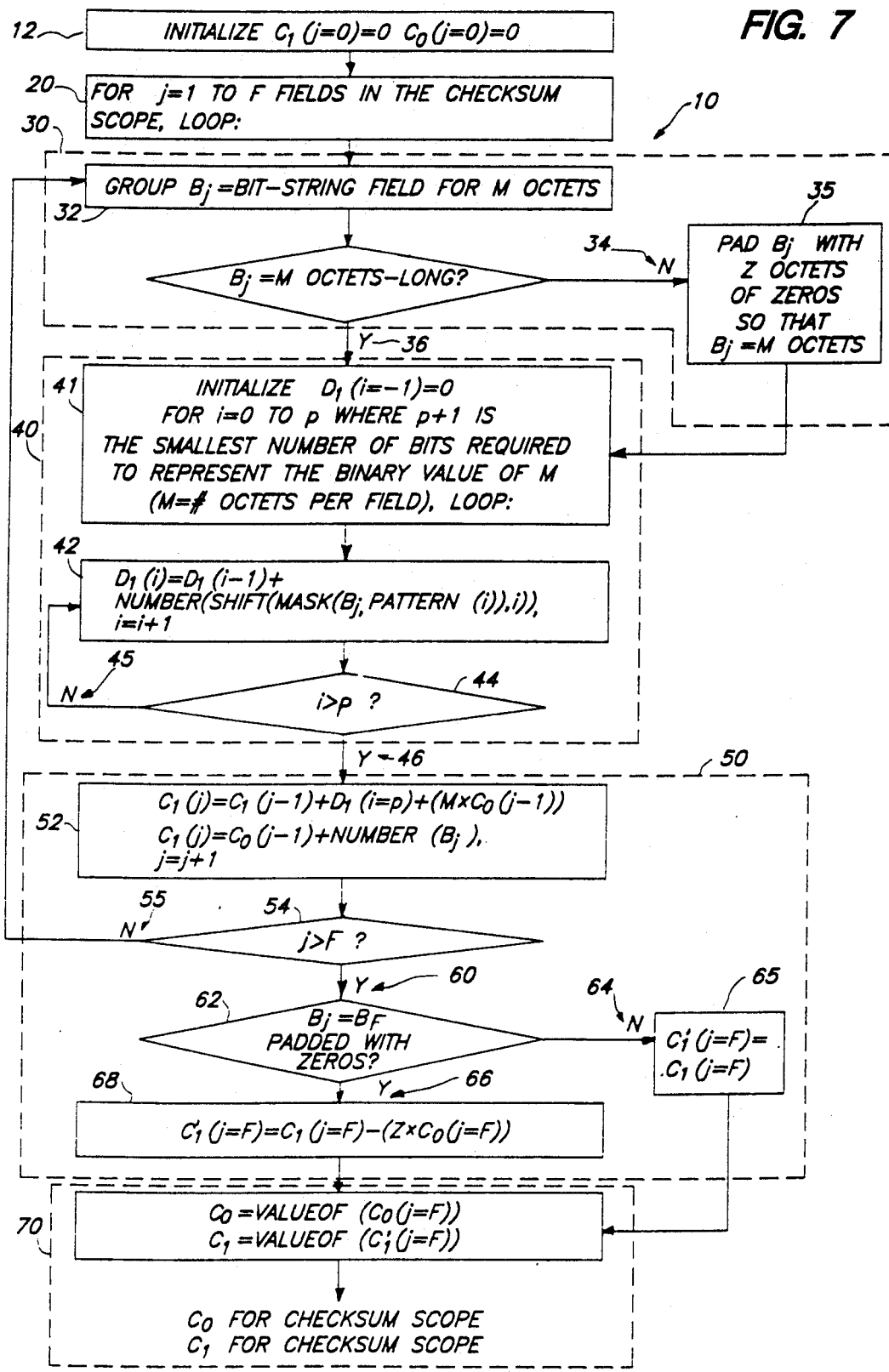

FIG. 7 is a detailed flow diagram of the checksum generation technique illustrated in FIG. 5.

FIGS. 8A-8E present the computation of the value of the $C_1$ increment variable, $D_1$, in the inner process loop of the checksum generation technique illustrated in FIG. 7, as that value is produced for an example octet field including five octets.

FIG. 9A is a diagram illustrating the addition of an example bit string with an example register string having the same number of bits as the bit string; this is one method for implementing the addition operations in the checksum generation technique of FIG. 7.

FIG. 9B is a diagram illustrating the addition of an example bit string with an example register string having a greater number of bits than the bit string; this is a second method for implementing the addition operations in the checksum generation technique of FIG. 7.

Figure 10:
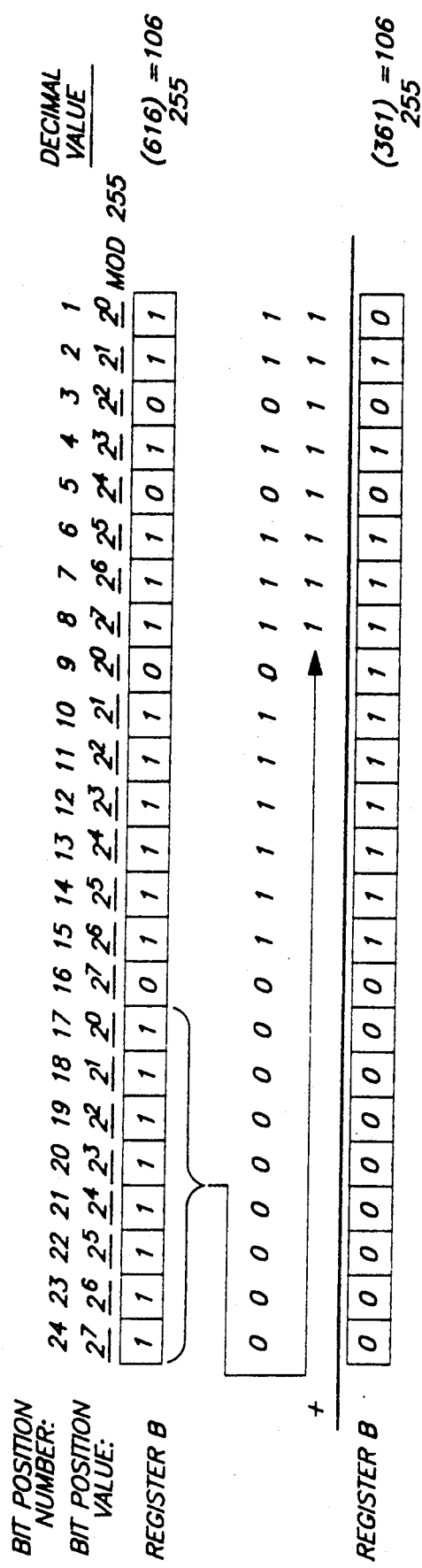

FIG. 10 is a diagram illustrating the addition of the eight most significant bits of an example register string of 24 bits back into the eight least significant bits of a copy of the bit string having the eight most significant bits set to zero; this is a method for ensuring that any hardware registers like the hardware register of FIG. 9B that are used in the checksum generation technique of FIG. 7 will not overflow as bit strings are added to them.

Figure 11A:
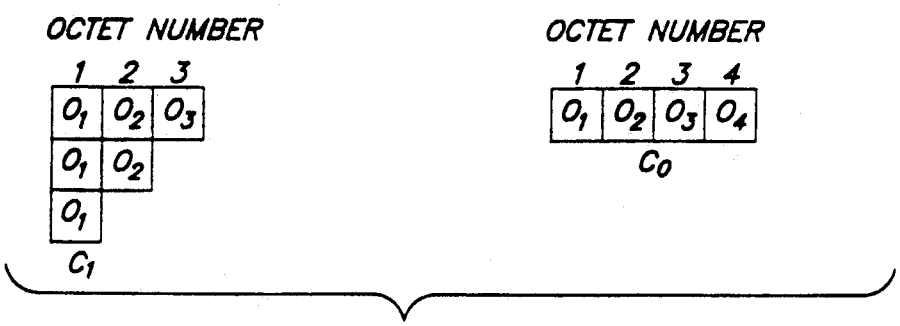
Figure 11B:
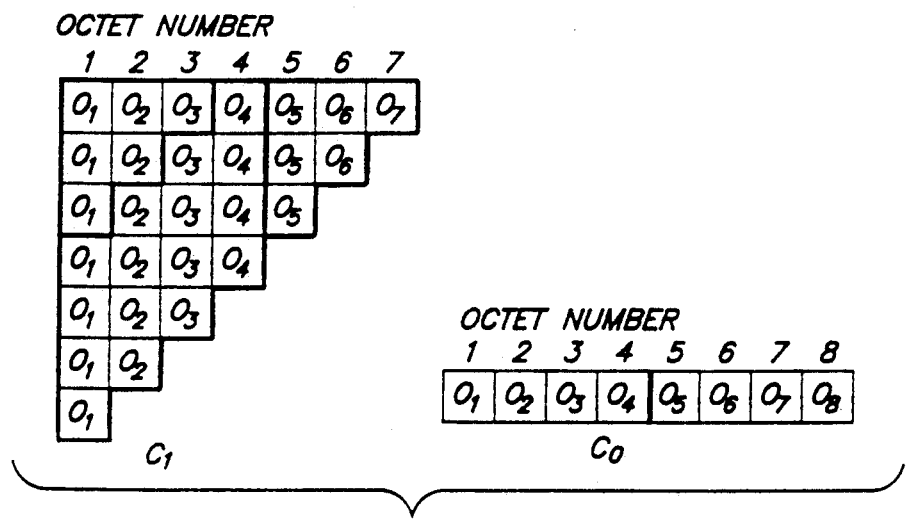
Figure 11C:
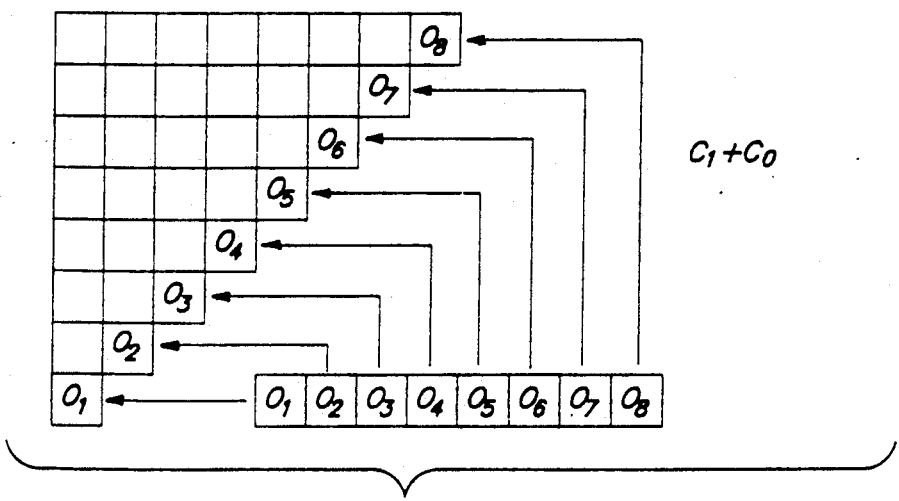

FIGS. 11A-11C are diagrams illustrating pictorial representations of the checksum variables $C_0$ and $C_1$ as they are produced after a first and second process loop, respectively, of the checksum generation technique of FIG. 7, specified to process octet fields including a number, M, of octets that is a power of two, here, as an example, including eight octets.

Figures 12A, 12B:
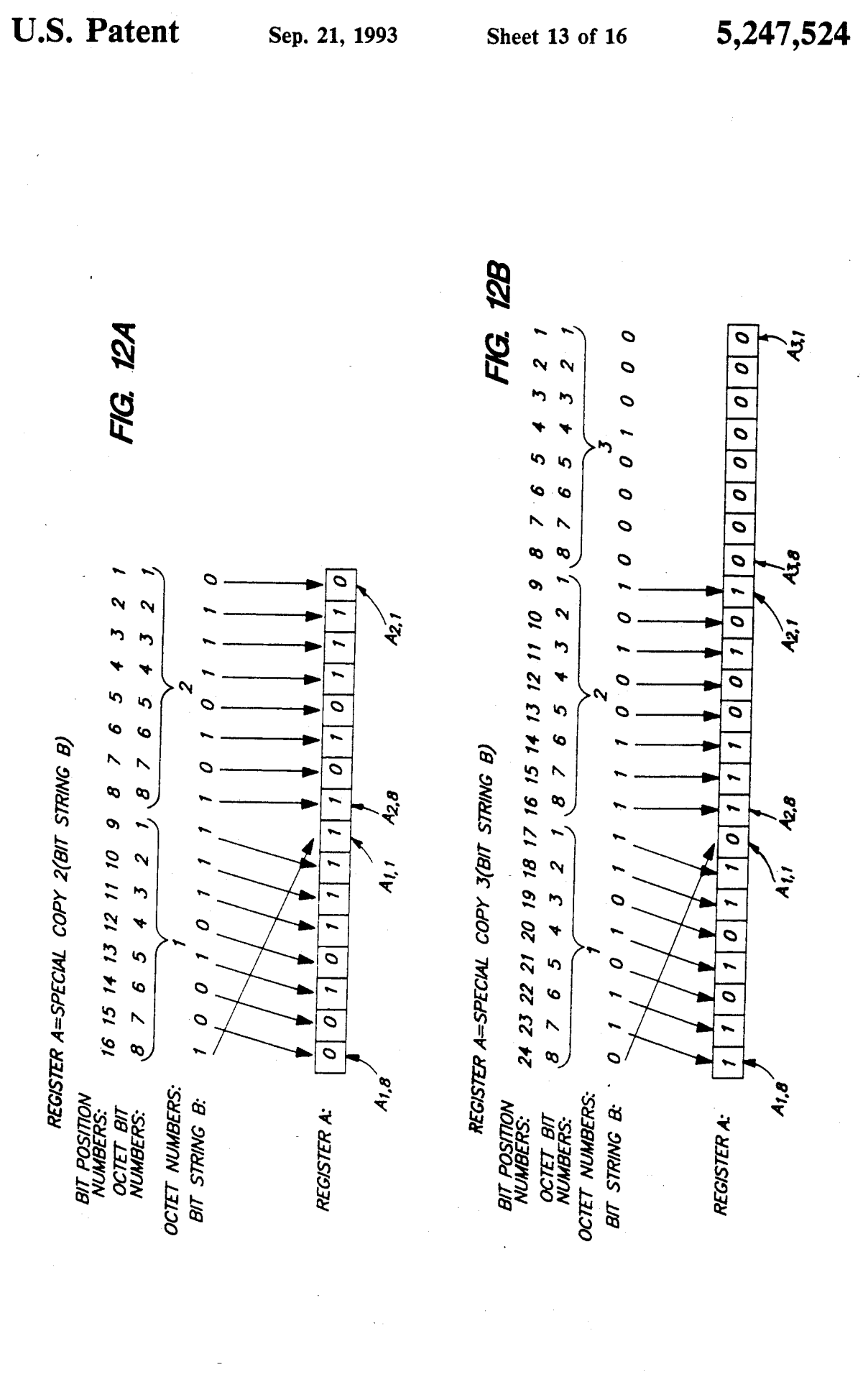

FIG. 12A is a diagram illustrating an example bit rearrangement of a bit string of 16 bits as the bit string is copied to a register string also having 16 bits during the inner process loop of a refined version of the checksum generation technique of FIG. 7.

FIG. 12B is a diagram illustrating an example bit rearrangement of a bit string of 24 bits as the bit string is copied to a register string also having 24 bits during the inner process of a refined version of the checksum generation technique FIG. 7.

Figure 13A:
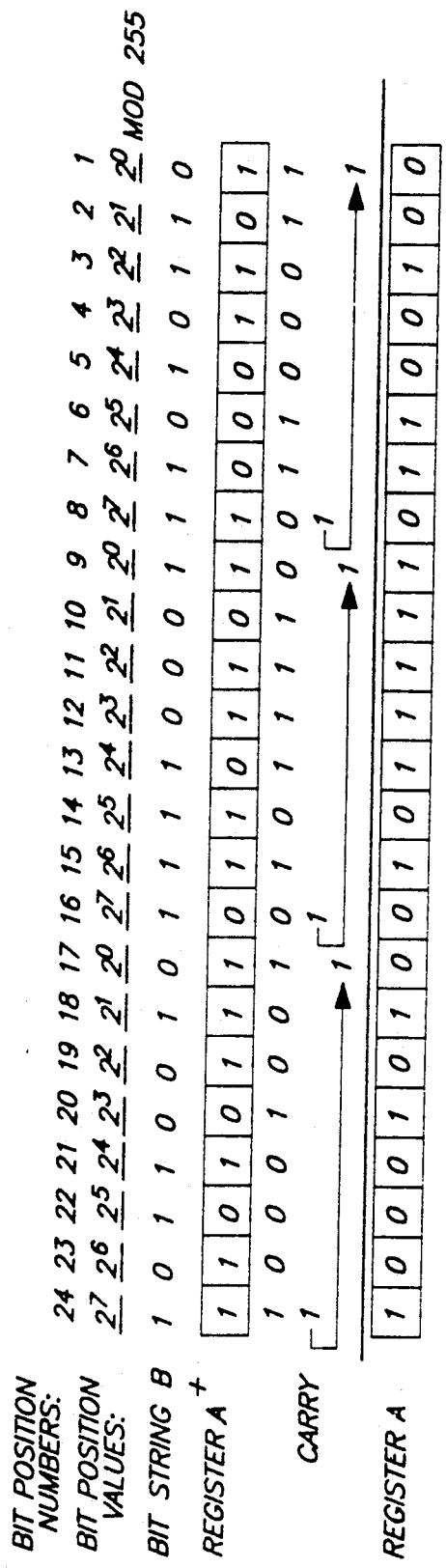

FIG. 13A is a diagram illustrating the addition of an example bit string with an example register string having the same number of bits as the bit string; this is a third method for implementing the addition operations in the checksum generation technique of FIG. 7.

Figure 13B:
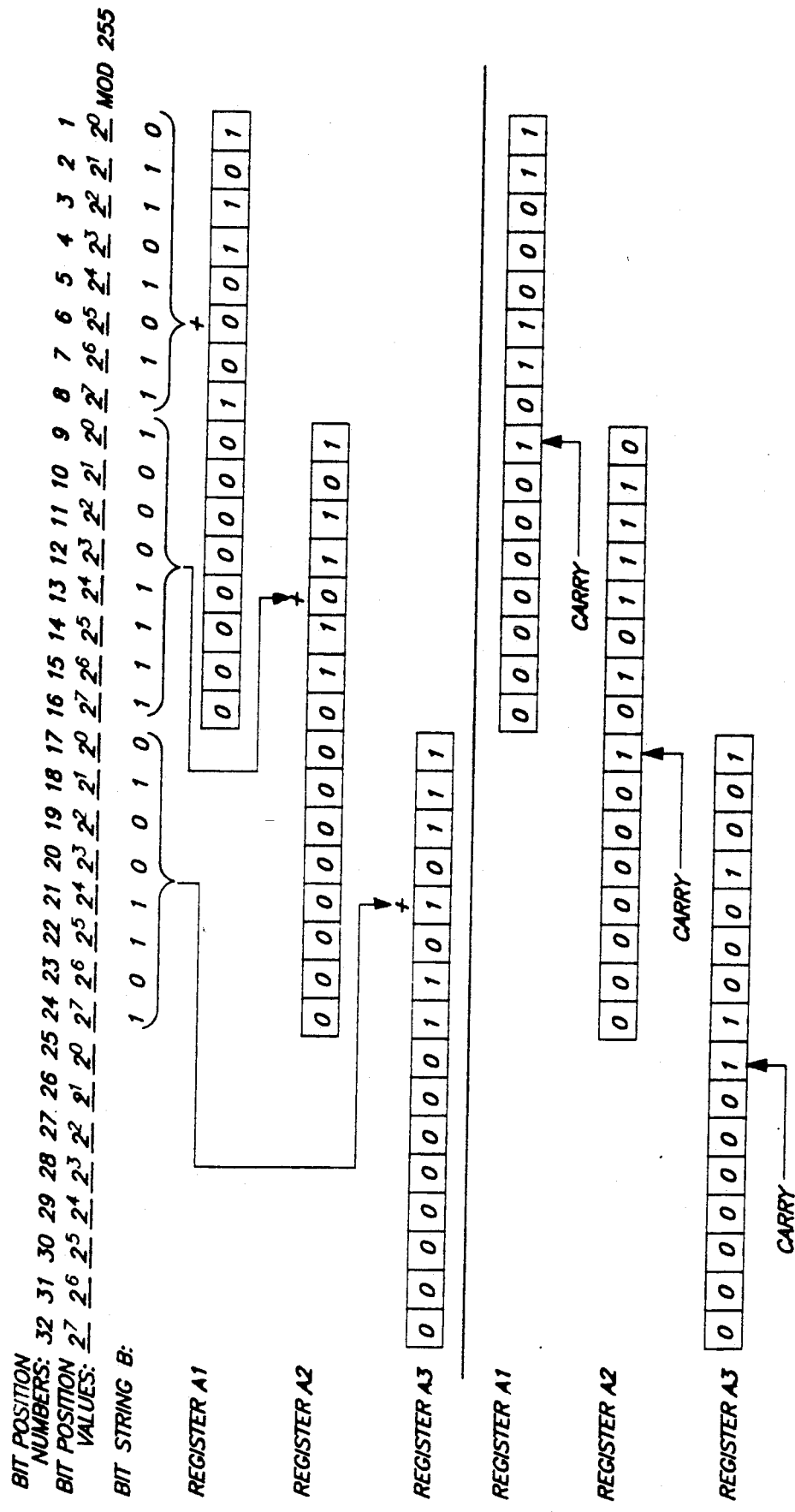

FIG. 13B a diagram illustrating the addition of an example bit string with an example register string having the same number of bits as the bit string but having each of its octets stored in a separate register; this is a fourth method for the addition operations in the checksum generation technique of FIG. 7.

Figures 14A, 14B, 14C, 14D:
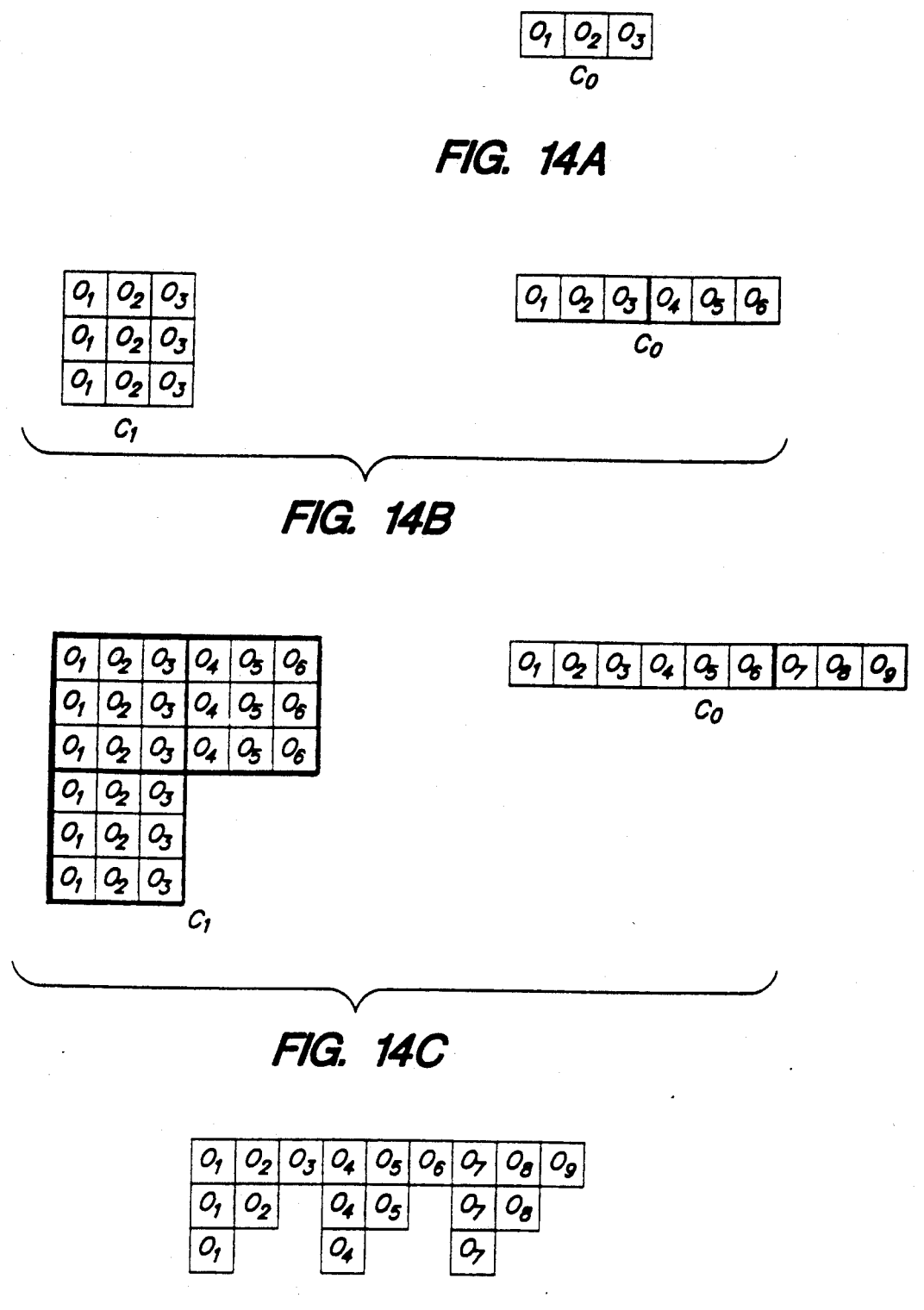

FIGS. 14A-14 C are diagrams illustrating pictorial representations of the checksum variables $C_0$ and $C_1$ as they are produced by a first, second, and third, respectively, iteration of the inner process loop of a refined version of the checksum generation technique of FIG. 7 specified to process octet fields each including three octets.

FIG. 14D a diagram illustrating the number of octet value blocks by which the pictorial representation of $C_0$ in FIG. 14A is deficient.

Referring to FIG. 3, a processor generates a checksum for a checksum scope of a bit string by grouping the bits in the checksum scope into a number, L, of octets, and further grouping the L octets of the checksum scope into F consecutive octet fields of M octets each, for a total of $L=F\times M$ octets in the checksum scope. Each octet field has a sequential position, j, in the checksum scope, with the octet field positions ranging from $j=1$ to F. Within an octet field, each octet has a sequential position, i, with the octet positions ranging from $i=1$ to M. Given this sequential enumeration, the first octet of the checksum scope has a position $i,j=1,1$, and the last, or Lth, octet has a position $i,j=M,F$. Accordingly, the $i,j=1,1$ [M,F] positioned octet is first [last] submitted to the network during an information packet transmittal.

Each octet in the checksum scope has an octet value, $O_{ij}$, that is equal to the sum of the bit position values assigned to the bits in that octet that are a "1". As shown in FIG. 3, for example, the 5th octet in the 3rd Octet field, having the bit sequence 10110101, has an octet value $O_{53}$ that is equal to the decimal value 181.

By processing each of the F octet fields in the checksum scope in the manner discussed below, a processor generates the checksum, which comprises two checksum variables, $C_0$ and $C_1$, whose final values depend on the checksum scope's octet values as follows:

$$C_0 = \left[ \sum_{j=1}^{F} \sum_{i=1}^{M} O_{ij} \right] \mod 255, \text{ and}$$

$$C_1 = \left[ \sum_{j=1}^{F} \sum_{i=1}^{M} (F \times M - M \times (j-1) - i + 1) \times O_{ij} \right] \mod 255.$$

After processing all F octet fields in the checksum scope, a processor thus produces a value for $C_0(j=F,i=M)$ that is equal to the arithmetic sum of the octet values in the checksum scope, and a value for $C_1(j=F,i=M)$ that is equal to the weighted arithmetic sum of the octet values in the checksum scope.

Referring to FIG. 4, the values of $C_0(j=F,i=M)$ and $C_1(j=F,i=M)$, as given above, are generated by processing each octet field in turn, in each case evaluating the octet field to obtain an octet field value, $N_j$, for the octet field. The example octet field in FIG. 4, which could be of any octet field position "j" in a checksum scope, includes 24 bits, or $M=3$ octets. To evaluate this octet field, a processor would assign a bit position value to each bit in the octet field as follows. As shown in FIG. 4, starting with the right-most (least significant) bit, each bit position is assigned the value $(2^b) \mod 255$, with b ranging from 0 to 7. Once the sequence of values $(2^0) \mod 255$ to $(2^7) \mod 255$ has been assigned, the sequence is repeated until every bit in the octet field has a bit position value equal to a value between $(2^2) \mod 255$ and $(2^7) \mod 255$. This bit position enumeration thereby assigns each eight-bit sequence with corresponding octet bit position values without explicitly grouping each octet first.

Once these bit position values have been assigned, the octet field is given an octet field value $N_j$ that is the sum, mod 255, of the bit position values assigned to the bits in the octet field that are a "1". For the example octet field of FIG. 4, this bit position assignment and evaluation produces an octet field value $N_j$ that is equal to (532) mod 255, or 22 base 10. A given octet field value $N_j$ is thus precisely the same as the value that would result if each octet in the octet field were individually grouped and evaluated for an octet value $O_i$, and then each of the octet values were added, mod 255. Stated another way, with this octet field bit position assignment, the binary representation of the sum, mod 255, of the octet values in an octet field is bit-wise identical to the field itself. This correspondence has important advantages for implementing a technique to generate the checksum variables $C_0$ and $C_1$.

Referring to FIG. 5, a processor generates values for the checksum variables $C_0$ and $C_1$ using the checksum generation technique 10. Each octet field "j" ($j=1$ to F) in the checksum scope is processed in sequence, for a total of F process loops, as specified 20 by the generation technique. Within each process loop, the bits of a single octet field are first grouped 30 to form an M octet-long bit string. Using the octet field evaluation process discussed above, values for the checksum variables $C_0$ and $C_1$ are then generated 40 for octet field "j", whereby $C_0$ for octet field "j" is equal to $N_j$ (the value of octet field "j"), and $C_1$ for octet field "j" is equal to the weighted sum of octet values within octet field "j".

Following this process, the values of the checksum variables $C_0$ and $C_1$ for the checksum scope are updated 50 by adding the generated octet field values to the running variables $C_0(j)$ and $C_1(j)$. If, after processing octet field "j," other unprocessed octets remain in the checksum scope, the processor then loops back 55 to group 30 and process 40 those succeeding octet fields. With the processing of octet field F, the last octet field, the processor completes 60 evaluation of the checksum scope, and the last updated values 70 of the running variables $C_0(j)$ and $C_1(j)$ become the final checksum variable values for the checksum scope.

Figures 2A, 2B:
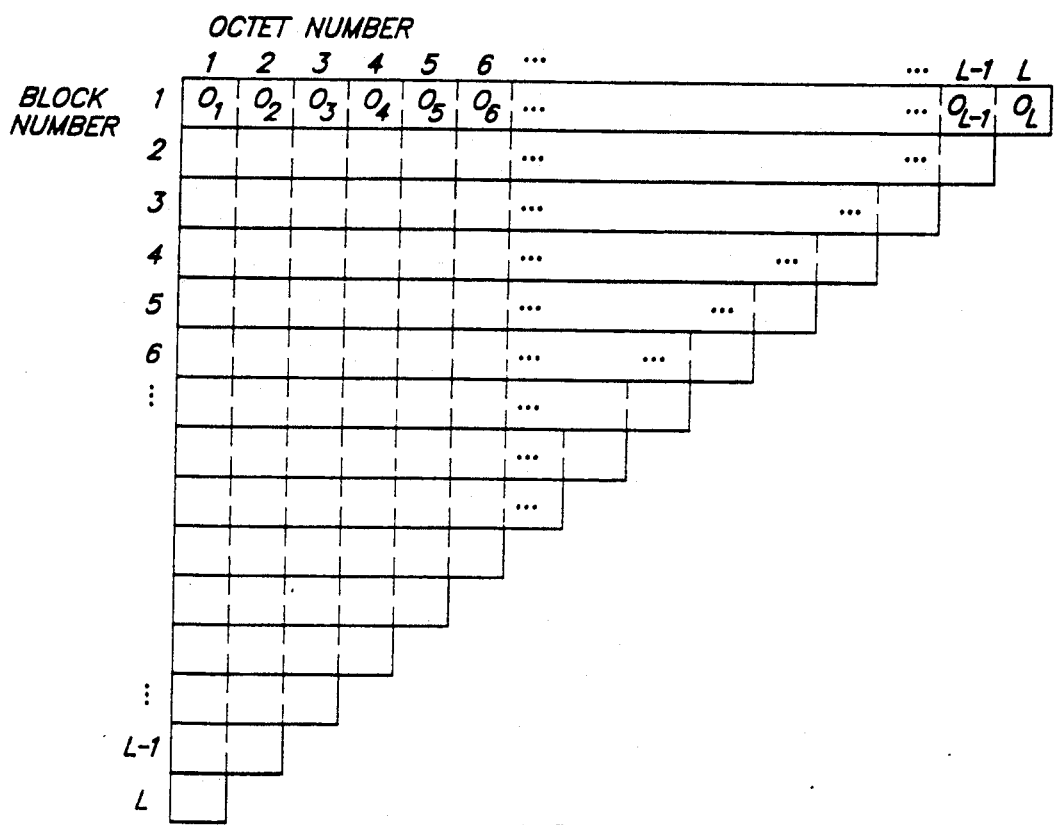
FIG. 2A is a diagram illustrating a pictorial representation of the checksum variable $C_0$.
FIG. 2B is a diagram illustrating a pictorial representation of the checksum variable $C_1$.

Using this technique, the arithmetic sums comprising the checksum variables $C_0(j=F,i=M)$ and $C_1(j=F,i=M)$ have pictorial representations as shown in FIGS. 2A and 2B, respectively. Recalling these, the rectangular representation of $C_0(j=F,i=M)$ includes one octet value block for each octet in the checksum scope; the triangular staircase value of $C_1(j=F, i=M)$ includes one octet value block for the last octet in the checksum scope, and an increasing number of octet value blocks for each of the preceding octets, with the first octet contributing L octet value blocks.

The rectangular representation of $C_0(j=F,i=M)$ and the triangular representation of $C_1(j=F,i=M)$ are "built" by a processor as it iteratively loops through the checksum generation technique (FIG. 5). Referring also to FIG. 6A, if, for example, the checksum scope includes 9 octets, with $F=3$ octet fields of $M=3$ octets each, a processor's first loop through the generation technique produces a $C_0(j=1)$ rectangle with three octet value blocks, and $C_1(j=1)$ triangle that contains M ($=3$) octet value blocks for the first octet, M-1 ($=2$) octet value blocks for the second octet, and 1 octet value block for the $M^{th}$ (third) octet of the first octet field.

Upon a second loop through the checksum technique, as shown in FIG. 6B, a processor adds the $C_1(j=1)$ triangle with a rectangle consisting of $M \times C_0(j=1)$ octet value blocks and a $C_1$ triangle increment to produce a $C_1(j=2)$ triangle. The $C_1$ triangle increment contains a weighted number of octet value blocks for the octets of the second octet field, using the same weighting scheme as in the $C_1(j=1)$ triangle. The second loop also produces a $C_0(j=2)$ rectangle by adding the three octet value blocks of the second octet field to the $C_0(j=1)$ rectangle.

Finally, after the third, and last, loop through the generation technique, as shown in FIG. 6C, a processor adds the $C_1(j=2)$ triangle with a rectangle consisting of $M \times C_0(j=2)$ octet value blocks and a $C_1$ triangle increment for the third octet field to produce a $C_1(j=3)$ triangle; the $C_0(j=3)$ rectangle is produced in this loop by adding the three octet value blocks of the third octet field to the $C_0(j=2)$ rectangle.

Given the choice in this example of $F=3$ octets of $M=3$ octets each, the checksum generation technique requires only 3 iterative loops to generate a checksum value for all 9 octets in the example checksum scope.

Considering each of the steps of the checksum generation technique in more detail, the following operations define specific processing functions.

NUMBER(bit-string) is defined to be the operation of interpreting a specified bit string, which includes M octets, as a mod 255 number, i.e., treating the bit string as a number stored in M octets. The operation NUMBER is therefore computationally null, but distinguishes between a string of bits and the mod 255 number that could be represented by that string of bits. For example, the operation NUMBER(011010101101010111010101), which is acting on a bit string of $M=3$ octets, produces a mod 255 integer which has a bit-wise identical representation to the bit string, i.e., 011010101101010111010101.

VALUEOF(bit-string) is defined to be the operation of assigning a mod 255 value to an integer bit string, e.g., an integer bit string produced by the NUMBER operation. For example, the operation VALUEOF(NUMBER(011010101101010111010101)) produces a mod 255 integer having the equivalent decimal value of 22.

MASK(bit-string, mask-string) is defined to be the operation of masking a first specified bit string with a second, masking bit string, to produce a third bit string. Both the first and masking bit strings are specified to be of length M octets, and thereby produce a third bit string which is also of length M octets. In the masking operation, if a given bit of the masking bit string is a "1", then the corresponding bit of the first specified bit string appears in the corresponding bit of the third bit string, while if a given bit of the masking bit string is a "0", then the corresponding bit of the third bit string is also a "0". For example, the operation MASK(10101011, 01101001) produces the bit string 00101001 by "masking" the bits of the first bit string with the masking bit string.

SHIFT(bit-string, integer) is defined to be the operation of circularly shifting, to the left, a specified mod 255 bit string by a number, "integer", of bits. This circular shifting causes any bits that are "shifted" off of the left end (most significant bit) of the bit string to be inserted back at the right end (least significant bit) of the bit string. The effective result of the SHIFT operation is the multiplication, mod 255, of the specified bit string by a factor of $2^{integer}$. For example, the operation SHIFT(10110100, 3) produces the bit string 10100101. The original bit string, which has a decimal value, mod 255, of 180, when multiplied, mod 255, by $w^3$ produces a decimal value of 165, which is equal to the mod 255 value of the shifted bit string, 10100101, as expected.

The following bit string specifications are used with the above operations.

$B_j$ is defined to be the bit string in the $j^{th}$ octet field of the checksum scope, and includes M octets. Thus, $B_j$ comprises the $8 \times M$ bits in the $j^{th}$ octet field.

PATTERN1(i) is defined (for $i \geq 0$) to be a bit string of length M octets having bit values each of which are a function of the value of the integer variable "i" as follows. Starting with the right-most (least significant) bit, the bit string includes a number (possibly zero), $(2^i-1) \times 8$, of bits with the value zero, followed by a number, $2^i \times 8$, of bits with the value one, etc., up to the bit string length of $8 \times M$ bits. In other words, all of the bits in the $m^{th}$ octet of the M octet-long (m=1 to M) PATTERN1(i) bit string have the value "1" only if an integer with the value m, when represented as a binary number, includes a "1" in the bit position having the bit position value $2^i$. For example, the bit string specification PATTERN1(1), given an octet specification of $M=4$ octets of bits, produces the following bit string:

00000000111111111111111100000000, because for m=1 to 4, only m=2 and m=3 have a binary representation, 10 and 11, respectively, which includes a "1" in the bit position having the bit position value $2^9 = 2^q = 2$ (the left-most bit).

$C_0(j)$ and $C_1(j)$ are defined to be the updated values of the checksum variables $C_0$ and $C_1$, and thus include the contribution of each octet field in the checksum scope up to and including octet field j. Both $C_0(j)$ and $C_1(j)$ are specified as mod 255 numbers that are represented by bit strings of lengths equal to an integral number of octets, with the number of octets specified for particular processing configurations, as discussed below.

$D_1(i)$ is defined to be the running intermediate value of the octet field checksum variable $C_1$, i.e., the intermediate contribution of the $j^{th}$ octet field to the value of the updated checksum variable $C_1(j)$ as the contribution is incrementally generated. $D_1(i)$ is specified as a mod 255 number which is represented by a bit string of a length equal to an integral number of octets, with the number of octets specified as discussed below.

Referring to FIG. 7, with these operational definitions, the checksum generation technique, when implemented in a processor using conventional hardware, executes the operations defined above using conventional hardware registers of a length M octets or longer to store the results of the various operations. To begin the checksum generation process 10, the values of the updated checksum variables $C_1(j)$ and $C_0(j)$ are initialized 12 by the processor to both equal zero. The processor then processes 20 each of the F octet fields (j=1 to F) in the checksum scope in turn, with the same processing steps, for a total of F processing loops.

Within each process loop, the processor groups 30 an octet field "j" by first assembling 32 the bit string "$B_j$" from the next $8 \times M$ bits to be processed in the checksum scope, where M is the prespecified number of octets to be included in each octet field. It is assumed that the checksum scope includes an integral number of octets. If there are not enough succeeding octets of bits in the checksum scope to fill the M octet-long bit string "$B_j$", i.e., the checksum scope is not M octets-long 34, the processor "pads" 35, or appends, a number of octets of zeros to the end (right side) of the bit string to give the bit string the correct length of $8 \times M$ bits. The number of padded zeros is equal to $8 \times Z$, where Z is the number of octets required to be added to the bit string to give the bit string the correct length, and so may take any value between 0 and (M−1). This padding will inherently only be required of the last bit string $B_{j=F}$ assembly because all preceding bit string assemblies will have the required number of bits.

If the assembled bit string "$B_j$" does not require any length adjustment 36, the processor begins an inner process loop 40 for that bit string by initializing 41 the value of the incremental checksum variable $D_1(i)$ to equal zero. Within this inner process loop 40, the processor completes a prespecified number, p+1, of computations on the bit string "$B_j$", where p+1 is the smallest number of bits required to represent the value of M as a binary number. That is, if, e.g., M=3 (3 octets in each octet field), with a binary representation for M of 11, p would be equal to 1, because two bits are required to represent this value of M.

With each inner loop repetition the processor generates 42 an intermediate octet field checksum variable value $D_1(i)$ for that loop repetition as follows:

$$D_1(i) = D_1(i-1) + \text{NUMBER}(\text{SHIFT}(\text{MASK}(B_j, \text{PATTERN1}(i)), i)).$$

Stated in words, the intermediate octet field checksum variable $D_1(i)$ is equal to the sum of the value of the $D_1(i)$ component from the last inner loop repetition plus the resultant value of the nested operations in the second addend above, which are discussed below.

After generating the intermediate octet field checksum variable value $D_1(i)$ for the inner loop repetition "i", the value of "i" is incremented 42. If the incremented value of "i" is less than or equal to the value of the variable "p", the processing system loops back 45 to the inner process loop generating step 42 to continue generating incremental octet field checksum variable values. If, however, the inner loop repetition variable "i" is greater 46 than the value of "p", then the inner loop processing repetition is complete and the processor exits the inner loop to continue further processing.

Referring also to FIG. 8, the inner processing loop 40 (FIG. 7) is considered for an example octet field "j" having M=5 octets, wherein each octet has an octet value $0_{ij}$ for i=1 to 5, as shown in FIG. 8A. Given that the bits within the example octet field have been assembled to form a bit string $B_j$, this bit string is to be processed by the inner loop 40 a number, p+1, of times, With the number "p" equal to 2, as determined by the binary representation of M=5, as discussed above.

On the first inner loop repetition (i=0), shown in FIG. 8B, the loop generation computation 42 takes the form NUMBER(SHIFT(MASK($B_j$, PATTERN1(0)), 0)), where the bit string PATTERN1(0) has the sequence 111111110000000011111111000000001111111. Use of this PATTERN1(0) bit string in the above relationship produces a result as follows, considering the innermost nested operation first. MASK($B_j$, PATTERN1(0)) produces a bit string having the same first, third, and fifth octets as the original bit string $B_j$, and second and fourth octets of all zeros. SHIFT(MASK(B, PATTERN1 0)), 0) shifts the new bit string by 0 bits, or multiplies the bit string by a factor of 1. NUMBER(SHIFT (MASK($B_j$, PATTERN1(0)), 0)) then evaluates the resultant bit string to designate that bit string as a mod 255 integer. Due to the inner nested operations, the value of this integer includes the sum of $(1 \times O_{1j}) + (1 \times O_{3j}) + (1 \times O_{5j})$, because the first, third, and fifth octets of the original bit string were included in the newly produced bit string. This bit string is then equal to the intermediate octet field checksum variable $D_1$ (i=0) for octet field j.

With "i" incremented to be equal to the value 1 in the inner loop generation step 42, as shown in FIG. 8C, the nested operations first produce (using the MASK operation) a bit string having only the same third and fourth octets as the original bit string $B_j$. These two octets are then shifted (using the SHIFT operation) to be equal to the product mod 255, of the octets and the number 2. Finally, the shifted bit string is designated to produce the second mod 255 integer bit string, whose value includes the sum of $(2 \times O_{3j}) + (2 \times O_{4j})$. This bit string is "added in" to the first intermediate value $D_1(0)$ to produce the updated octet field checksum variable $D_1(1)$. In a similar process, as shown in FIG. 8D, when "i" is incremented to be equal to the value 2, the nested operations produce a bit string having only the same first and second octets as the original bit string B . These two octets are shifted to be equal to the product mod 255, of the octets and the number $2^2$ (=4). The shifted bit string is then designated as the final mod 255 integer bit string, whose value includes the sum of $(3 \times O_{1j}) + (4 \times O_{2j})$. The final intermediate value $D_1(2)$ is then obtained by adding the last bit string in with the previous incremental value $D_1(1)$.

After this final inner process loop repetition, the value of the last intermediate octet field checksum variable, $D_1(2)$, is equal to the weighted sum of the octet values in the octet field, as shown in FIG. 8E. Accordingly, the value of the example octet field variable $D_1(2)$ is the same as the value that would be obtained by serially grouping and summing the octet values as $(5 \times O_{1j}) + (4 \times O_{2j}) + (3 \times O_{3j}) + (2 \times O_{4j}) + (1 \times O_{5j})$. Thus, after completing the inner processing loop, the complete octet field checksum variable $C_1$ for octet field "j" is obtained with a number, p+1, of shift, mask, and addition operations to produce the same result that would be obtained with a number, M, of multiplication operations and M−1 addition operations.

Referring again to FIG. 7, after completing the inner process loop for one octet field of the checksum scope, the processor updates 50 the checksum variables for the checksum scope. The running update variable $C_1(j)$ is generated 52 to be equal to the sum of the last updated running update variable, $C_1(j-1)$, plus the latest incremental octet field checksum variable, $D_1(i=p)$, plus the product of M times last updated value of the checksum variable $C_0$, $C_0(j-1)$.

This last multiplication requires a number, S, of shift and add operations on the bit string representing the value $C_0(j-1)$, with the value "S" being equal to the number of bits having the value 1 in a binary representation of the octet field variable M. For example, if M=5, giving a binary representation of 101, "S" is equal to the value 2, because two of the three bits in the binary representation of M=5 have the value 1.

The running update checksum variable $C_0(j)$ is also similarly updated 52 as the sum of the last updated $C_0(j)$ value plus the mod 255 integer represented by the designation of the NUMBER($B_j$) operation on the last assembled bit string $B_j$. Using the $C_1(j)$ and $C_0(j)$ update operations, the processor keeps a running value of the checksum scope variables as each octet field in the checksum scope is processed in sequence. Before completing the update 52, the value of the octet field position variable j is incremented.

The processor then checks 54 the field position variable value; if the incremented value of j is less than or equal to the number, F, of octet fields in the checksum scope, the processor loops back 55 to begin assembly 30 and processing 40 of the next octet field bit string $B_j$. If the incremented value of j is greater 60 than F, the processor has completed assembling and processing each of the octet fields, and so begins the final processing steps required to determine the values of the checksum scope variables.

In these final processing steps, the processor first checks 62 whether the last-processed octet field contains padded zeros, i.e., was not as long as the $B_j$ bit string length. Given that a number 8×Z of zeros were appended 62 to the last octet field, the value of the checksum variable $C_1(j=F)$ is too large by an amount equal to $Z \times C_0(j=F)$. Therefore, to correct the checksum variable value $C_1(j=F)$, the processor subtracts 68 the value $Z \times C_0(j=F)$ from the value of $C_1(j=F)$ to obtain a modified value $C_1(j=F)$. If no zeros were appended to the checksum scope length 64, the value $C_1'(j=F)$ is defined 65 as the unchanged value $C_1(j=F)$. Finally, to obtain the values 70 of the checksum variables for the entire checksum scope, the processing system completes the VALUEOF operation using the mod 255 integer bit strings of each of the checksum variables $C_0(j=F)$ and $C_1'(j=F)$.

As discussed above, a processor using conventional hardware executes the operations of the checksum generation technique with conventional hardware registers of a length "M" octets or longer to store the bit strings resulting from the various operations. If, for example, the designated hardware registers have lengths equal to M octets, or equivalently, 8×M bits, i.e., the number of bits in one octet field bit string $B_j$, the arithmetic operation of addition used in the various checksum generation Operations must be specified to correspond with this register length.

Referring to FIG. 9A, an example addition operation is shown for a register, RegisterA, that is 16 bits, or two octets long. In this example, M, the number of octets in an octet field, is also taken to be equal to two. If RegisterA were specified to store some result of the checksum generation technique, e.g., the update value $C_0(j)$, then new $C_0(j)$ bit string components would be continually added to the register.

Because all bit strings that are used or generated by the checksum generation technique are specified as mod 255 integers, bit position values are implicitly assigned to the new bit string component and RegisterA string as follows. Starting with the right-most (least significant) bit, each corresponding bit position of the bit string and register string is assigned a value ranging from $(2^0)$ mod 255 to $(2^7)$ mod 255, with the sequence of bit position values repeating until each bit position in the bit string and register string has a value. For the example bit string and register string of FIG. 9A, which each include 16 bits, this bit position value assignment designates two octets in each string of bits.

To add the new bit string component With the RegisterA string, each of the bit values of the two strings, ranging from the first bit position to the fifteenth bit position, are added together, with any carry bit being added to the next most significant bit from the bit that generated the carry. Any carry bit that is generated by the sum of the bits in the sixteenth bit position is wrapped around to be added back into the least significant (first) bit.

Referring also to FIG. 9B, an alternative example addition operation is shown for a register, RegisterB, that is 24 bits, or three octets long. In this example, M, the number of octets in an octet field, is again taken to be equal to two. If RegisterB were specified to store some result of the checksum generation technique, e.g., the update value $C_1(j)$, then, like RegisterA (FIG. 9A), RegisterB would continually have new $C_1(j)$ bit string components added to it. As discussed above, both the bits of RegisterB and the bits of any bit string components added to RegisterB have implicit bit position value assignments that designate the octets in each string of bits. Accordingly, the new component bit string of FIG. 9B is seen to have two designated octets, while RegisterB is seen to have three designated octets.

The extra left-most eight bits (1 octet) that are included in RegisterB are used during an addition operation in the following way. Before beginning the checksum generation process, all of RegisterB's bits are initialized to zero. To add a new bit string component with the RegisterB string, each of the bit values of the two strings, ranging from the first bit position to the fifteenth bit position, are added together, with any carry bit being added to the next most significant bit from the bit that generated the carry. Any carry that is generated by the sum of the bits in the sixteenth bit position is added into the seventeenth bit position.

As new bit string components are added to RegisterB, carries that are generated by the sixteenth bit position sum in each addition operation are added in with the left-most 8 additional bits in RegisterB. This carry "storage" in the most significant octet of RegisterB is an alternative provision to the scheme in FIG. 9A for ensuring that overflow of RegisterB does not occur, unless a sufficient number of high order bits in RegisterB's are set to a 1, due to a number of additions. Depending on the particularly chosen value of M in a checksum generation process, the size of the storage registers may alternatively be more than 1 octet greater than the size of the octet fields. For example, with hardware storage registers of 6 octets in length and octet fields of 4 octets in length (M=4), two left-most octets in each register would be available for "storing" carries generated during addition operations.

Comparing the example addition operations of FIGS. 9A and 9B, while not immediately apparent, each of the addition schemes provides an identical integer representation for the addition result of a given bit string and register string. In each of FIGS. 9A and 9B, the new bit string component is given as 1101101001011001, and the RegisterA and RegisterB strings are both given as 010010010010010. Although each of the addition operations handles the most significant carry bit in a different manner, the final result of the operations is the same, i.e., each of the final bit strings has the same decimal value, 107. The mod 255 cyclical bit position value assignments of the bit strings and registers are what provide for this correspondence. Thus, either of the addition operations of FIGS. 9A or 9B may be used to obtain the same result.

Referring to FIG. 10, as discussed above, both of the addition schemes in FIG. 9 ensure that overflow of a hardware register will not occur unless sufficient high order bits of that register are equal to "i" To guard against this occurrence, a further register operation may be employed during the checksum generation process. As shown in FIG. 10, if the most significant octet in RegisterB is designated to "store" extra carries, the bits of that octet may be periodically "folded," or added back into the eight least significant bits of the register to "clear out" the most significant octet.

To accomplish this folding process, the bit values of RegisterB's most significant octet are added, in the manner described above, to a copy of the RegisterB string that has those bit values set to zero. Any carries generated by this addition are handled just as if a new bit string component were being added to the register.

In the example of FIG. 10, the RegisterB string of 1111111011111101101011 is folded to achieve the register string of 000000011111111111101010. This folding effectively subtracts one multiple of 255 from the register. However, because the register string inherently has bit position value assignments that are cyclical, mod 255, removal of any number of multiples of 255 from the register does not change the value of the integer stored in the register. Thus, the original RegisterB string and the folded RegisterB string both have the same value, decimal 106, but the folded RegisterB string can accommodate the generation of more carry bits before overflowing.

If the range of bit string component magnitudes to be generated throughout the checksum generation process is known, then the number of addition operations which may be completed on a given register before that register will overflow may be computed for each of the operations in the checksum generation process. Given some number of "allowable" addition operations, to avoid overflow of the register, the folding operation described above may be periodically completed, thereby clearing the register to continue adding and storing values in the register without causing register overflow.

As discussed above, due to the cyclical, mod 255, bit position value assignment of the register string, the original register string and the folded register string have the same value (decimal 235) because both are multiples of the number 255. Given a particularly chosen register length, which may be greater than 2 octets in length, the folding operation in FIG. 10B may be used to fold any number of octets in a register string back into itself. For example, given a register of 6 octets in length, the bits of the three most significant octets in the register could be folded back into the register after a predetermined number of allowable addition operations have been completed with the register, whereby the register is protected from overflowing at any time.

Considering again the steps of the checksum generation process 10 (FIG. 7), the process may be refined if the number, M, of octets in each octet field is prespecified to be equal to an integral power of 2, i.e., $2^b$, where "b" is an integer. In this case, the computation step 42 of the inner processing loop 40, which generates incremental values $D_1(i)$ for the octet field checksum variable $C_1$, may be simplified for the following consideration. With M as a power of 2, during the last iteration of the inner loop, only one octet of the masked $B_j$ bit string has a nonzero value. This is expected, because the MASK and PATTERN1 operations use the binary representation of the octet numbers within an octet field to set the MASK bits that determine which octets will be included in a given MASK operation; the binary representation of the value of $2^b$ requires one more bit than the binary representation of the value of $(2^b-1)$. Therefore, the number of inner process loop iterations may be reduced by adding one less multiple of each octet value in an octet field, and then recovering this deficiency only after all of the octet fields a checksum scope have been processed.

Referring to FIG. 11, building of the pictorial triangle representation for $C_1$ and the rectangular representation for $C_0$ is shown for this case. Considering an example checksum generation process with M specified as 4 ($2^2$) and F specified as 2, i.e., 2 octet fields of 4 octets each, the checksum generation process proceeds as follows. As shown in FIG. 11A, after processing the first octet field, the $C_0(j=1)$ rectangle includes one octet value block for each octet in the first octet field, While the $C_1(j=1)$ triangle is lacking one octet value block for each of those octets.

As shown in FIG. 11B, after processing the second, and last octet field in the example checksum scope, the $C_0(j=F)$ rectangle correctly includes one octet value block for each of the octets in the checksum scope, but the $C_1(j=F)$ triangle is lacking one octet value block for each of the checksum scope octets; the $C_1(j=F)$ triangle should include eight octet value blocks for octet 1, and a decreasing number of blocks for the succeeding octets, with octet 8 having one octet value block. Using only one operation, as shown in FIG. 11C, this deficiency is corrected by adding the $C_0(j=F)$ rectangle to the $C_1(j=F)$ triangle, whereby the correct number of octet value blocks is included in the triangle. This checksum generation scheme thereby eliminates one set of SHIFT, MASK, and addition operations from each iteration of the checksum inner process loop, for a total of F eliminated MASK, SHIFT, and addition operations in the overall checksum generation process.

The refined checksum generation process utilizes a bit string specification PATTERN2(i) that is defined to be a bit string of length M octets having bit values that are a function of the value of the integer variable "i", as follows. Starting with the right-most (least significant) bit, the bit string includes a number, $2^i \times 8$, of bits with the value zero, followed by a number, $2^i \times 8$, of bits with the value one, followed by a number, $2^i \times 8$, of bits with the value zero, etc, up to the bit string length of $8 \times M$ bits. In other words, all of the bits in the $m^{th}$ octet of the M octet-long (m=1 to M) PATTERN2(i) bit string have the value "1" only if an integer with the Value (m−1), then represented as a binary number, includes a "1" in the bit position having the bit position value $2^i$. For example, the bit string specification PATTERN2(1), given an octet specification of M=4 octets of bits, produces the following bit string:

1111111111111111000000000000000, because for m=1 to 4, only m=3 and m=4 numbered octets have a binary representation for (m−1) (3 and 2, respectively), that includes a "1" in the bit position having the bit position value $2^i = 2^1 32$ 2 the second bit), i.e. 11 and 11, respectively.

Referring again to FIG. 7, substitution of this PATTERN2(i) bit string specification in the generation step 42 of the checksum inner process loop 40 produces the refined algorithm, which requires a refined loop specification 41 as follows:

For i=0 to (b−1), where b is the power of two corresponding to the value of the octet variable "M", i.e., $M=2^b$, loop:

As discussed above, the refined inner process loop 40 produces a final incremental octet field checksum variable that is equal to the sum of $(0 \times O_{Mj}) + (-1 \times O_{(M-1)j}) + \ldots + ((M-1) \times O_{1j})$. After evaluating all of the octet fields in the checksum scope with this inner loop, the update operation 50 produces the correct value for $C_0(j=F)$, but produces a value for $C_1(j=F)$ that is too small by an increment of $C_0(j=F)$, as explained above.

To account for this deficiency, the refined checksum generation technique requires the final evaluation 70 of the checksum variables to be modified as follows:

$C_0 = VALUEOF(C_0(j=F))$ $C_1 = VALUEOF(C_1'(j=F) + C_0(j=F))$

This evaluation step adds the required additional octet value blocks to the $C_1(j=F)$ triangle, as discussed in connection with FIG. 11A.

A further process refinement is obtained in the update processing operation 50 when the number of octets M in each octet field is an integral power of 2 as $M=2^b$. The computation "$(M \times C_0(j-1))$" in the update operation 48 may be implemented by one left circular shift of the bit string $C_0(j)$ by a number "b", of bits, because shifting a bit string by b bits corresponds to multiplication of that bit string by $2^b$ mod (255).

The checksum generation process may be implemented in a processor having conventional hardware, or may alternatively be implemented in a processor having customized hardware that is specifically configured for the various operations used in the checksum process. Considering this second possible implementation, the checksum generation process may be completed by a processor having hardware registers which permit specific rearrangement of the bits in a bit string whenever that bit string is copied to a register.

Referring to FIG. 12, this specialized copy function utilizes predefined operations to specify the particularly chosen bit rearrangement. The operation SPECIALCOPYM(bit-string) is defined to create a copy of a specified bit string with a predefined rearrangement of the bit string's bits, depending on the number, M, of octets that are included in each octet field of the checksum scope. FIG. 12A shows an example copy operation using this specialized bit rearrangement with a register, RegisterA, and a bit string, bit stringB, that are both 16 bits-long, or M=2 octets-long. The following notation is used to denote each of the bits in bit stringB and RegisterA. denotes bit number "y" of octet number "x" in RegisterA. Similarly $B_{x,y}$ denotes bit number "y" of octet number "x" in bit stringB. Taken from left to right, octets in the bit string and register string are numbered starting with 1, while within each octet, bits are numbered from 1 to 8 starting with the rightmost (least significant) bit. Accordingly, as shown in FIG. 12A, the leftmost bit in RegisterA is denoted $A_{1,8}$, while the rightmost bit in RegisterA is denoted $A_{2,1}$. The operation SPECIALCOPYM(bit-string), when invoked as RegisterA = SPECIALCOPY2(bit stringB) copies bit stringB to RegisterA as follows $A_{1,1} \leftarrow B_{1,8}$ $A_{1,y} \leftarrow B_{1,y-1} \quad y = 2 \ldots 8$ $A_{2,y} \leftarrow B_{2,y} \quad y = 1 \ldots 8$ With this bit specification, the RegisterA string is seen to be a copy of bit stringB with bit stringB's first (leftmost) octet left circularly shifted by one bit and second (rightmost) octet unchanged. That is, the RegisterA string includes $2 \times$(octet 1) and $1 \times$(octet 2) of bit stringB.

Considering a checksum generation process in which the number of octets in each octet field is specified as three (M=3), FIG. 12B shows the result of the SPECIALCOPYM(bit-sting) operation when it is invoked using a bit string, bit stringB, and a register, RegisterA, that each include 24 bits, or M=3 octets. In this case, the operation SPECIALCOPYM(bit-string), when invoked as RegisterA = SPECIALCOPY3(bit stringB) copies bit string B to RegisterA as follows:

$A_{1,1} \leftarrow B_{1,8}$ $A_{1,y} \leftarrow B_{1,y-1} \quad y = 2 \ldots 8$ $A_{2,y} \leftarrow B_{2,y} \quad y = 1 \ldots 8$ $A_{3,y} \leftarrow 0 \quad y = 1 \ldots 8$ With this bit specification, RegisterA is seen to be a copy of bit stringB with bit stringB's first octet left circularly shifted by one bit, second octet unchanged, and third octet masked, or nulled, to zero.

The two SPECIALCOPYM(bit-string) operations described above are examples of operations for efficiently implementing the checksum generation process with hardware registers that have at least as many bits as each octet field in the checksum scope. For example, if the number M of octets in each octet field of the checksum scope is specified to be two, the following substitutions in the checksum generation technique (FIG. 7) produce a refined checksum generation technique, CHECKSUM2.

CHECKSUM2

Process loop specification 20:

For $j=1$ through F, where F is the number of octet fields of $M=2$ octets in the checksum scope,
Loop:
Inner process loop 40 and update operation 52 combined:

$C_1(j) = C_1(j-1) + \text{NUMBER}(\text{SPECIALCOPY2}(B_j)) + 2 \times C_0(j-1)$, $C_0(j) = C_0(j-1) + \text{NUMBER}(B_j)$, $j = j + 1$ Referring to the checksum generation process of FIG. 7, the above CHECKSUM2 specification eliminates the entire inner processing loop 40 by incorporating the SPECIALCOPY2 operation in the update operation 52. Thus, the lo SPECIALCOPY2, by specifying bit placement, produces the same results as the SHIFT, MASK, PATTERN1, and addition operations of the inner process loop 40, and eliminates a corresponding number of those operations, thereby increasing the speed of the overall process. The operation "$2 \times C_0(j-1)$" in CHECKSUM2 may be completed by either one left circular shift of the bit string $C_0(j-1)$ or by two separate addition operations.

As a second example, if the number M of octets in each octet field of the checksum scope is specified to be three, the following CHECKSUM3 specifications produce a refined checksum generation technique using the SPECIALCOPY3 operation described above in connection with FIG. 12B.

CHECKSUM3

Process loop specification 40:
For $j=1$ through F, where F is the number of blocks of octet fields of $M=3$ octets in the checksum scope,
Loop:
Inner process loop 40 and update operation 52 combined:

$C_1(j) = C_1(j-1) + \text{NUMBER}(\text{SPECIALCOPY3}(B_j)) + 3 \times C_0(j-1)$, $C_0(j) = C_0(j-1) + \text{NUMBER}(B_j)$, $j = j + 1$ Again referring to the checksum generation process of FIG. 7, the above CHECKSUM3 specification, like the CHECKSUM2 specification, eliminates the entire inner processing loop 40 by incorporating the SPECIALCOPY3 operation in the update operation 52. Thus, following the bit rearrangement of FIG. 12b, this process generates the update variables $C_0(j)$ and $C_1(j)$ by rearranging the bits of the bit string $B_j$, rather than explicitly adding the octets in the bit string $B_j$, thereby increasing the speed of the process. In this process specification, the operation "$3 \times C_0(j-1)$" may be completed by an addition and a left circular shift of one bit and an addition operation, or by three separate addition operations.

Like the refined checksum generation process described above for instances when M is a power of 2, the CHECKSUM3 process requires the evaluation step 70 (FIG. 7) to be refined as follows, whereby the $C_1(j=F)$ triangle (which in this case is deficient by one $C_0(j=F)$ rectangle) is modified:

Evaluation 70:
$C_0 = \text{VALUEOF}(C_0(j=F))$
$C_1 = \text{VALUEOF}(C_1'(j=F) + C_0(j=F))$ The following CHECKSUM specifications, one each for $M = 4, 5, 6, 7, 8, 16$ and 24 octets per octet field, when substituted for the inner processing loop 40 and update operations 50 of the checksum generation process, generate the checksum update variables by rearranging bit positions, rather than shifting, masking, and adding octet bits in each octet field. As should now be clear, this is possible because the cyclical, mod 255, bit position valuing used in these processes designates that the "$y^{th}$" bit of a given octet in a bit string has the same bit position value as the "$y^{th}$" bit of any other octets in the bit string. With this correspondence, the bits of a bit string may be rearranged as they are copied to bits of a register string so that, while they may be copied to an octet position different from their original octet position, they have the same bit value. SPECIALCOPYM(bit-string) operations in each specification are customized for the particular number of octet field octets given by that specification.

CHECKSUM4

Define SPECIALCOPY4(bit-string) to be an operation which copies a bit string to a register as follows. If RegisterA and bit stringB are each 32 bits-long, then
RegisterA = SPECIALCOPY(bit stringB) copies bit stringB to RegisterA as follows:

$A_{1,1} \leftarrow B_{1,8}$ $A_{1,y} \leftarrow B_{1,y-1} \quad y = 2 \ldots 8$ $A_{2,y} \leftarrow B_{1,y} \quad y = 1 \ldots 8$ $A_{3,1} \leftarrow B_{2,8}$ $A_{3,y} \leftarrow B_{2,y-1} \quad y = 2 \ldots 8$ $A_{4,y} \leftarrow B_{3,y} \quad y = 1 \ldots 8$ Process loop specification 20:
For $j-1$ through F, where F is the number of blocks of octet fields of $M=4$ octets in the checksum scope,
Loop:
Inner processing loop 40 and update operation 52 combined:

$C_1(j) = C_1(j-1) + \text{NUMBER}(\text{SPECIALCOPY4}(B_j)) + 4 \times C_0(j-1)$, $C_0(j) = C_0(j-1) + \text{NUMBER}(B_j)$, $j = j + 1$ This CHECKSUM4 process, like the CHECKSUM3 process, requires that the evaluation step 70 (FIG. 7) of the checksum process be replaced as follows:

Evaluation 70:
$C_0 = \text{VALUEOF}(C_0(j=F))$
$C_1 = \text{VALUEOF}(C_1'(j=F) + C_0(j=F))$

CHECKSUM5

Define SPECIALCOPY5(bit-string) to be an operation which copies a bit string to a register as follows. If RegisterA and bit stringB are each 40 bits-long, then
RegisterA = SPECIALCOPY5(bit stringB) copies bit stringB to ResisterA as follows:

$A_{1,2} \leftarrow B_{1,8}$
$A_{1,1} \leftarrow B_{1,7}$

-continued

| | |
|---|---|
| $A_{1,y} \leftarrow B_{1,y-2}$ | $y = 3 \ldots 8$ |
| $A_{2,1} \leftarrow B_{2,8}$ | |
| $A_{2,y} \leftarrow B_{2,y-1}$ | $y = 2 \ldots 8$ |
| $A_{3,y} \leftarrow B_{2,y}$ | $y = 1 \ldots 8$ |
| $A_{4,1} \leftarrow B_{3,8}$ | |
| $A_{4,y} \leftarrow B_{3,y-1}$ | $y = 2 \ldots 8$ |
| $A_{5,y} \leftarrow B_{4,y}$ | $y = 1 \ldots 8$ |

Process loop specification 20:

For j=b 1 through F, where F is the number of octet fields of M=1 through F, where F is the number of octet fields of M=5 octets in the checksum scope,
Loop:
Inner processing loop 40 and update operation 52 combined:

$$C_1(j) = C_1(j-1) + \text{NUMBER}(\text{SPECIALCOPY5}(B_j)) + 5 \times C_0(j-1),$$

$$C_0(j) = C_0(j-1) + \text{NUMBER}(B_j),$$

$$j = j + 1$$

This process requires that the evaluation step of the checksum process be modified as follows:

Evaluation 70:
$C_0 = \text{VALUEOF}(C_0(j=F))$
$C_1 = \text{VALUEOF}(C_1'(j=F) + C_0(j=F))$

CHECKSUM6

Define SPECIALCOPY6i(bit-string) to be an operation which copies a bit string to a register as follows. If RegisterA and bit stringB are each 48 bits-long, then
RegisterA = SPECIALCOPY6i(bit stringB) copies bit stringB to RegisterA as follows:

| | |
|---|---|
| $A_{1,2} \leftarrow B_{1,8}$ | |
| $A_{1,1} \leftarrow B_{1,7}$ | |
| $A_{1,y} \leftarrow B_{1,y-2}$ | $y = 3 \ldots 8$ |
| $A_{2,2} \leftarrow B_{2,8}$ | |
| $A_{2,1} \leftarrow B_{2,7}$ | |
| $A_{2,y} \leftarrow B_{2,y-2}$ | $y = 3 \ldots 8$ |
| $A_{3,2} \leftarrow B_{3,8}$ | |
| $A_{3,1} \leftarrow B_{3,7}$ | |
| $A_{3,y} \leftarrow B_{3,y-2}$ | $y = 3 \ldots 8$ |
| $A_{4,1} \leftarrow B_{4,8}$ | |
| $A_{4,y} \leftarrow B_{4,y-1}$ | $y = 2 \ldots 8$ |
| $A_{5,1} \leftarrow B_{5,8}$ | |
| $A_{5,y} \leftarrow B_{5,y-1}$ | $y = 2 \ldots 8$ |
| $A_{6,y} \leftarrow B_{6,y}$ | $y = 1 \ldots 8$ |

Similarly, the operation
RegisterA = SPECIALCOPY6ii(bit stringB) copies bit stringB to RegisterA as follows:

| | |
|---|---|
| $A_{1,1} \leftarrow B_{1,8}$ | |
| $A_{1,y} \leftarrow B_{1,y-1}$ | $y = 2 \ldots 8$ |
| $A_{2,y} \leftarrow B_{2,y}$ | $y = 1 \ldots 8$ |
| $A_{3,y} \leftarrow 0$ | $y = 1 \ldots 8$ |
| $A_{4,y} \leftarrow B_{4,y}$ | $y = 1 \ldots 8$ |
| $A_{5,y} \leftarrow 0$ | $y = 1 \ldots 8$ |
| $A_{6,y} \leftarrow 0$ | $y = 1 \ldots 8$ |

Process loop specification 20:

For j=1 through F, where F is the number of octet fields of M=6 octets in the checksum scope,
Loop:
Inner processing loop 40 and update operation 52 combined:

$$C_1(j) = C_1(j-1) + \text{NUMBER}(\text{SPECIALCOPY6i}(B_j)) + \text{NUMBER}(\text{SPECIALCOPY6ii}(B_j)) + 6 \times C_0(j-1).$$

$$C_0(j) = C_0(i-1) + \text{NUMBER}(B_j).$$

$$j = j + 1$$

CHECKSUM7

Define SPECIALCOPY7i(bit-string) to be an operation which copies a bit string to a register as follows. If RegisterA and bit stringB are bit each 56 bits-long, the
RegisterA = SPECIALCOPY7i(bit stringB) copies bit stringB to RegisterA as follows:

| | |
|---|---|
| $A_{1,2} \leftarrow B_{1,8}$ | |
| $A_{1,1} \leftarrow B_{1,7}$ | |
| $A_{1,y} \leftarrow B_{1,y-2}$ | $y = 3 \ldots 8$ |
| $A_{2,1} \leftarrow B_{1,8}$ | |
| $A_{2,y} \leftarrow B_{1,y-1}$ | $y = 2 \ldots 8$ |
| $A_{3,2} \leftarrow B_{2,8}$ | |
| $A_{3,1} \leftarrow B_{2,7}$ | |
| $A_{3,y} \leftarrow B_{2,y-2}$ | $y = 3 \ldots 8$ |
| $A_{4,2} \leftarrow B_{3,8}$ | |
| $A_{4,1} \leftarrow B_{3,7}$ | |
| $A_{4,y} \leftarrow B_{3,y-2}$ | $y = 3 \ldots 8$ |
| $A_{5,1} \leftarrow B_{5,8}$ | |
| $A_{5,y} \leftarrow B_{5,y-1}$ | $y = 2 \ldots 8$ |
| $A_{6,1} \leftarrow B_{6,8}$ | |
| $A_{6,y} \leftarrow B_{6,y-1}$ | $y = 2 \ldots 8$ |
| $A_{7,y} \leftarrow B_{7,y}$ | $y = 1 \ldots 8$ |

Similarly, the operation
RegisterA = SPECIALCOPY7ii(Bit stringB) copies bit stringB to RegisterA as follows:

| | |
|---|---|
| $A_{1,y} \leftarrow B_{1,y}$ | $y = 1 \ldots 8$ |
| $A_{2,1} \leftarrow B_{2,8}$ | |
| $A_{2,y} \leftarrow B_{2,y-1}$ | $y = 2 \ldots 8$ |
| $A_{3,y} \leftarrow B_{3,y}$ | $y = 1 \ldots 8$ |
| $A_{4,2} \leftarrow B_{4,8}$ | |
| $A_{4,1} \leftarrow B_{4,7}$ | |
| $A_{4,y} \leftarrow B_{4,y-2}$ | $y = 3 \ldots 8$ |
| $A_{5,y} \leftarrow B_{5,y}$ | $y = 1 \ldots 8$ |
| $A_{6,y} \leftarrow 0$ | $y = 1 \ldots 8$ |
| $A_{7,y} \leftarrow 0$ | $y = 1 \ldots 8$ |

Process loop specification 20:

For j=1 through F, where F is the number of octet fields of M=7 octets in the checksum scope,
Loop:
Inner processing loop 40 and update operation 52 combined:

$$C_1(j) = C_1(j-1) + \text{NUMBER}(\text{SPECIALCOPY7i}(B_j)) + \text{NUMBER}(\text{SPECIALCOPY7ii}(B_j)) + 7 \times C_0(j-1),$$

$$C_0(j) = C_0(j-1) + \text{NUMBER}(B_j),$$

$$j = j + 1$$

CHECKSUM8

Define SPECIALCOPY8i(bit-string) to be an operation which copes a bit string to a register as follows. If RegisterA and bit stringB are both 64 bits-long, then
RegisterA = SPECIALCOPY8i(bit stringB) copies bit stringB to RegisterA as follows:

| | |
|---|---|
| $A_{1,3} \leftarrow B_{1,8}$ | |
| $A_{1,2} \leftarrow B_{1,7}$ | |
| $A_{1,1} \leftarrow B_{1,6}$ | |
| $A_{1,y} \leftarrow B_{1,y-3}$ | $y = 4 \ldots 8$ |
| $A_{2,2} \leftarrow B_{2,8}$ | |

-continued

| | |
|---|---|
| $A_{2,1} \leftarrow B_{2,7}$ | |
| $A_{2,y} \leftarrow B_{2,y-2}$ | $y = 3 \ldots 8$ |
| $A_{3,2} \leftarrow B_{3,8}$ | |
| $A_{3,1} \leftarrow B_{3,7}$ | |
| $A_{3,y} \leftarrow B_{3,y-2}$ | $y = 3 \ldots 8$ |
| $A_{4,2} \leftarrow B_{4,8}$ | |
| $A_{4,1} \leftarrow B_{4,7}$ | |
| $A_{4,y} \leftarrow B_{4,y-2}$ | $y = 3 \ldots 8$ |
| $A_{5,2} \leftarrow B_{5,8}$ | |
| $A_{5,1} \leftarrow B_{5,1}$ | |
| $A_{5,y} \leftarrow B_{5,y-2}$ | $y = 3 \ldots 8$ |
| $A_{6,1} \leftarrow B_{6,8}$ | |
| $A_{6,y} \leftarrow B_{6,y-1}$ | $y = 2 \ldots 8$ |
| $A_{7,1} \leftarrow B_{7,8}$ | |
| $A_{7,y} \leftarrow B_{7,y-1}$ | $y = 1 \ldots 8$ |
| $A_{8,y} \leftarrow B_{8,y}$ | $y = 1 \ldots 8$ |

Similarly, the operation
RegisterA = SPECIALCOPY8ii(bit stringB) copies bit stringB to RegisterA as follows:

| | |
|---|---|
| $A_{1,1} \leftarrow B_{2,8}$ | |
| $A_{1,y} \leftarrow B_{2,y-2}$ | $y = 2 \ldots 8$ |
| $A_{2,y} \leftarrow B_{2,y}$ | $y = 1 \ldots 8$ |
| $A_{3,1} \leftarrow B_{3,8}$ | |
| $A_{3,y} \leftarrow B_{3,y-1}$ | $y = 2 \ldots 8$ |
| $A_{4,y} \leftarrow B_{4,y}$ | $y = 1 \ldots 8$ |
| $A_{5,y} \leftarrow 0$ | $y = 1 \ldots 8$ |
| $A_{6,y} \leftarrow B_{6,y}$ | $y = 1 \ldots 8$ |
| $A_{7,y} \leftarrow 0$ | $y = 1 \ldots 8$ |
| $A_{8,y} \leftarrow 0$ | $y = 1 \ldots 8$ |

Process loop specification 20:
For $j = 1$ through F, where F is the number of octet fields of $M = 8$ octets in the checksum scope,
Loop:
Inner processing loop 40 and update operation 52 combined:

$$C_1(j) = C_1(j-1) + \text{NUMBER(SPECIALCOPY8i}(B_j)) + \text{NUMBER(SPECIALCOPY8ii}(B_j)) + 8 \times C_0(j).$$
$$C_0(j) = C_0(j-1) + \text{NUMBER}(B_j).$$
$$j = j + 1$$

CHECKSUM16

Define SPECIALCOPY816i(bit-string) to be an operation which copies a bit string to a register as follows. If RegisterA and bit stringB are both 128 bits-long, then
RegisterA = SPECIALCOPY16i(bit stringB) copies bit stringB to RegisterA as follows:

| | |
|---|---|
| $A_{1,3} \leftarrow B_{1,8}$ | |
| $A_{1,2} \leftarrow B_{1,7}$ | |
| $A_{1,1} \leftarrow B_{1,6}$ | |
| $A_{1,y} \leftarrow B_{1,y-3}$ | $y = 4 \ldots 8$ |
| $A_{2,1} \leftarrow B_{1,8}$ | |
| $A_{2,y} \leftarrow B_{1,y-1}$ | $y = 2 \ldots 8$ |
| $A_{3,3} \leftarrow B_{2,8}$ | |
| $A_{3,2} \leftarrow B_{2,7}$ | |
| $A_{3,1} \leftarrow B_{2,6}$ | |
| $A_{3,y} \leftarrow B_{2,y-3}$ | $y = 4 \ldots 8$ |
| $A_{4,1} \leftarrow B_{2,8}$ | |
| $A_{4,y} \leftarrow B_{2,y-1}$ | $y = 2 \ldots 8$ |
| $A_{5,2} \leftarrow B_{3,8}$ | |
| $A_{5,1} \leftarrow B_{3,7}$ | |
| $A_{5,y} \leftarrow B_{3,y-2}$ | $y = 3 \ldots 8$ |
| $A_{6,3} \leftarrow B_{4,8}$ | |
| $A_{6,2} \leftarrow B_{4,7}$ | |
| $A_{6,1} \leftarrow B_{4,6}$ | |
| $A_{6,y} \leftarrow B_{4,y-3}$ | $y = 4 \ldots 8$ |
| $A_{7,3} \leftarrow B_{5,8}$ | |
| $A_{7,2} \leftarrow B_{5,7}$ | |
| $A_{7,1} \leftarrow B_{5,6}$ | |
| $A_{7,y} \leftarrow B_{5,y-3}$ | $y = 4 \ldots 8$ |
| $A_{8,y} \leftarrow B_{5,y}$ | $y = 1 \ldots 8$ |
| $A_{9,1} \leftarrow B_{6,8}$ | |
| $A_{9,y} \leftarrow B_{6,y-1}$ | $y = 2 \ldots 8$ |
| $A_{10,y} \leftarrow B_{7,y}$ | $y = 1 \ldots 8$ |
| $A_{11,12} \leftarrow B_{9,8}$ | |
| $A_{11,1} \leftarrow B_{9,7}$ | |
| $A_{11,y} \leftarrow B_{9,y-2}$ | $y = 3 \ldots 8$ |
| $A_{12,y} \leftarrow B_{9,y}$ | $y = 1 \ldots 8$ |
| $A_{13,1} \leftarrow B_{10,8}$ | |
| $A_{13,y} \leftarrow B_{10,y-1}$ | $y = 2 \ldots 8$ |
| $A_{14,y} \leftarrow B_{11,y}$ | $y = 1 \ldots 8$ |
| $A_{15,y} \leftarrow B_{13,8}$ | |
| $A_{15,y} \leftarrow B_{13,y-1}$ | $y = 2 \ldots 8$ |
| $A_{16,1} \leftarrow B_{14,8}$ | |
| $A_{16,y} \leftarrow B_{14,y-1}$ | $y = 2 \ldots 8$ |

Similarly, the operation
RegisterA = SPECIALCOPY16ii(bit stringB) copies bit stringB to RegisterA as follows:

| | |
|---|---|
| $A_{1,2} \leftarrow B_{1,8}$ | |
| $A_{1,1} \leftarrow B_{1,7}$ | |
| $A_{1,y} \leftarrow B_{1,y-2}$ | $y = 3 \ldots 8$ |
| $A_{2,y} \leftarrow B_{1,y}$ | $y = 1 \ldots 8$ |
| $A_{3,2} \leftarrow B_{2,8}$ | |
| $A_{3,1} \leftarrow B_{2,7}$ | |
| $A_{3,y} \leftarrow B_{2,y-2}$ | $y = 3 \ldots 8$ |
| $A_{4,3} \leftarrow B_{3,8}$ | |
| $A_{4,2} \leftarrow B_{3,7}$ | |
| $A_{4,1} \leftarrow B_{3,6}$ | |
| $A_{4,y} \leftarrow B_{3,y-3}$ | $y = 4 \ldots 8$ |
| $A_{5,y} \leftarrow B_{3,y}$ | $y = 1 \ldots 8$ |
| $A_{6,2} \leftarrow B_{4,8}$ | |
| $A_{6,1} \leftarrow B_{4,7}$ | |
| $A_{6,y} \leftarrow B_{4,y-2}$ | $y = 3 \ldots 8$ |
| $A_{7,1} \leftarrow B_{5,8}$ | |
| $A_{7,y} \leftarrow B_{5,y-1}$ | $y = 2 \ldots 8$ |
| $A_{8,3} \leftarrow B_{6,8}$ | |
| $A_{8,2} \leftarrow B_{6,7}$ | |
| $A_{8,1} \leftarrow B_{6,6}$ | |
| $A_{8,y} \leftarrow B_{6,y-3}$ | $y = 4 \ldots 8$ |
| $A_{9,3} \leftarrow B_{7,8}$ | |
| $A_{9,2} \leftarrow B_{7,7}$ | |
| $A_{9,1} \leftarrow B_{7,6}$ | |
| $A_{9,y} \leftarrow B_{7,y-3}$ | $y = 4 \ldots 8$ |
| $A_{10,3} \leftarrow B_{8,8}$ | |
| $A_{10,2} \leftarrow B_{8,7}$ | |
| $A_{10,1} \leftarrow B_{8,6}$ | |
| $A_{10,y} \leftarrow B_{8,y-3}$ | $y = 4 \ldots 8$ |
| $A_{11,1} \leftarrow B_{9,8}$ | |
| $A_{11,y} \leftarrow B_{9,y-1}$ | $y = 2 \ldots 8$ |
| $A_{12,2} \leftarrow B_{10,8}$ | |
| $A_{12,1} \leftarrow B_{10,7}$ | |
| $A_{12,y} \leftarrow B_{10,y-2}$ | $y = 3 \ldots 8$ |
| $A_{13,2} \leftarrow B_{11,8}$ | |
| $A_{13,1} \leftarrow B_{11,7}$ | |
| $A_{13,y} \leftarrow B_{11,y-2}$ | $y = 3 \ldots 8$ |
| $A_{14,2} \leftarrow B_{12,8}$ | |
| $A_{14,1} \leftarrow B_{12,7}$ | |
| $A_{14,y} \leftarrow B_{12,y-2}$ | $y = 3 \ldots 8$ |
| $A_{15,y} \leftarrow B_{13,y}$ | $y = 1 \ldots 8$ |
| $A_{16,y} \leftarrow B_{15,y}$ | $y = 1 \ldots 8$ |

Process loop specification 20:
For $j = 1$ through F, where F is the number of octet fields of $M = 16$ octets in the checksum scope,
Loop:

$$C_1(j) = C_1(j-1) + \text{NUMBER(SPECIALCOPY16i}(B_j)) + \text{NUMBER(SPECIALCOPY16ii}(B_j)) + 16 \times C_0(j).$$
$$C_0(j) = C_0(j-1) + \text{NUMBER}(B_j).$$
$$j = j + 1$$

This CHECKSUM16 process requires that the evaluation step of the checksum process be modified as follows:

Evaluation 70:
$C_0 = \text{VALUEOF}(C_0(j=F))$
$C_1 = \text{VALUEOF}(C_1'(j=F) + C_0(j=F))$ The above special case checksum generation specifications all took advantage of the enhanced speed and efficiency made possible by the rearrangement of bits to achieve the same result as multiple MASK, SHIFT, and addition operations. The custom hardware used for these specifications designates that the "$th$" bit of a given octet in a bit string has the same bit position value as the "$y^{th}$" bit of any other octet in the bit string, whereby a bit may be shuffled from one octet to another and still maintain its original bit position value.

When implementing custom hardware to copy a bit string into a register, it is possible, for a given bit, to copy the inverse of the bit value to a specific bit position of the register, rather than copying the same bit value, as the above SPECIALCOPYM operations do. For example, if a given bit in a bit string has the value 0, then the value 1 would be copied into the corresponding bit position of the register string to which the bit string is being copied, an vise versa. The following refined checksum generation technique, CHECKSUM24, for use in processing octet fields having M=24 octets, takes advantage of this inverse bit copy operation.

CHECKSUM24

Define SPECIALCOPY24i(bit stringB) to be an operation which copies a bit string to a register as follows. If RegisterA and bit stringB are each 56 bits-long, then RegisterA = SPECIALCOPY24i(bit stringB)
copies bit stringB to RegisterA as follows:

$A_{x,4} \leftarrow B_{x,8}$    $x = 1, \ldots, 10$
$A_{x,3} \leftarrow B_{x,7}$    $x = 1, \ldots, 10$
$A_{x,2} \leftarrow B_{x,6}$    $x = 1, \ldots, 10$
$A_{x,1} \leftarrow B_{x,5}$    $x = 1, \ldots, 10$
$A_{x,y} \leftarrow B_{x,y-4}$    $y = 5, \ldots, 8; x = 1, \ldots, 10$ $A_{x,3} \leftarrow B_{x,8}$    $x = 11, \ldots, 17$
$A_{x,2} \leftarrow B_{x,7}$    $x = 11, \ldots, 17$
$A_{x,1} \leftarrow B_{x,6}$    $x = 11, \ldots, 17$
$A_{x,y} \leftarrow B_{x,y-3}$    $y = 4, \ldots, 8; x = 11, \ldots, 17$ $A_{x,2} \leftarrow B_{x,8}$    $x = 18, \ldots, 20$
$A_{x,1} \leftarrow B_{x,7}$    $x = 18, \ldots, 20$
$A_{x,y} \leftarrow B_{x,y-2}$    $y = 3, \ldots, 8; x = 18, \ldots, 20$ $A_{21,1} \leftarrow B_{21,8}$
$A_{21,y} \leftarrow B_{21,y-1}$    $y = 2, \ldots, 8$ $A_{22,y} \leftarrow B_{21,y}$    $y = 1, \ldots, 8$ $A_{23,1} \leftarrow B_{22,8}$
$A_{23,y} \leftarrow B_{22,y-1}$    $y = 2, \ldots, 8$ $A_{24,y} \leftarrow B_{23,y}$    $y = 1, \ldots, 8$ Similarly, the operation
RegisterA = SPECIALCOPY24ii(bit stringB) copies bit stringB to RegisterA as follows:

$A_{1,y} \leftarrow 0$    $y = 1, \ldots, 8$ $A_{2,3} \leftarrow B_{1,8}$
$A_{2,2} \leftarrow B_{1,7}$
$A_{2,1} \leftarrow B_{1,6}$
$A_{2,y} \leftarrow B_{1,y-3}$    $y = 4, \ldots, 8$ $A_{3,y} \leftarrow 1 - B_{1,y}$    $y = 1, \ldots, 8$ $A_{4,2} \leftarrow B_{2,8}$
$A_{4,1} \leftarrow B_{2,7}$
$A_{4,y} \leftarrow B_{2,y-2}$    $y = 3, \ldots, 8$ $A_{5,1} \leftarrow B_{2,8}$
$A_{5,y} \leftarrow B_{2,y-1}$    $y = 2, \ldots, 8$ $A_{6,2} \leftarrow B_{3,8}$
$A_{6,1} \leftarrow B_{3,7}$
$A_{6,y} \leftarrow B_{3,y-2}$    $y = 3, \ldots, 8$ $A_{7,y} \leftarrow B_{3,y}$    $y = 1, \ldots, 8$ $A_{8,2} \leftarrow B_{4,8}$
$A_{8,1} \leftarrow B_{4,7}$
$A_{8,y} \leftarrow B_{4,y-2}$    $y = 3, \ldots, 8$ $A_{9,1} \leftarrow B_{5,8}$
$A_{9,y} \leftarrow B_{5,y-1}$    $y = 2, \ldots, 8$ $A_{10,y} \leftarrow B_{5,y}$    $y = 1, \ldots, 8$ $A_{11,1} \leftarrow B_{6,8}$
$A_{11,y} \leftarrow B_{6,y-1}$    $y = 2, \ldots, 8$ $A_{12,y} \leftarrow B_{7,y}$    $y = 1, \ldots, 8$ $A_{13,y} \leftarrow 1 - B_{9,y}$    $y = 1, \ldots, 8$ $A_{14,1} \leftarrow 1 - B_{10,8}$
$A_{14,y} \leftarrow 1 - B_{10,y-1}$    $y = 2, \ldots, 8$ $A_{15,2} \leftarrow B_{11,8}$
$A_{15,1} \leftarrow B_{11,7}$
$A_{15,y} \leftarrow B_{11,y-2}$    $y = 3, \ldots, 8$ $A_{16,y} \leftarrow B_{11,y}$    $y = 1, \ldots, 8$ $A_{17,2} \leftarrow B_{12,8}$
$A_{17,1} \leftarrow B_{12,7}$
$A_{17,y} \leftarrow B_{12,y-2}$    $y = 3, \ldots, 8$ $A_{18,1} \leftarrow B_{13,8}$
$A_{18,y} \leftarrow B_{13,y-1}$    $y = 2, \ldots, 8$ $A_{19,y} \leftarrow B_{13,y}$    $y = 1, \ldots, 8$ $A_{20,1} \leftarrow B_{14,8}$
$A_{20,y} \leftarrow B_{14,y-1}$    $y = 2, \ldots, 8$ $A_{21,y} \leftarrow B_{15,y}$    $y = 1, \ldots, 8$ $A_{22,y} \leftarrow 1 - B_{17,y}$    $y = 1, \ldots, 8$ $A_{23,1} \leftarrow B_{18,8}$
$A_{23,y} \leftarrow B_{18,y-1}$    $y = 2, \ldots, 8$ $A_{24,y} \leftarrow B_{19,y}$    $y = 1, \ldots, 8$ Process loop specification 20:

For j=1 through F, where F is the number of octet fields of M=24 octets in the checksum scope, Loop:

Inner processing loop 40 and update operation 52 combined:

$C_1(j) = C_1(j-1) + \text{NUMBER}(\text{SPECIALCOPY24i}(B_j)) + \text{NUMBER}(\text{SPECIALCOPY24ii}(B_j)) + 24 \times C_0(j-1)$,
$C_0(j) = C_0(j-1) + \text{NUMBER}(B_j)$.
$j = j + 1$
Evaluation 70:
$C_0 = \text{VALUEOF}(C_0(j=F))$
$C_1 = \text{VALUEOF}(C_1'(j=F) + C_0(j=F))$ An additional refinement to the checksum algorithm may be used where the register is larger than the bit string.

CHECKSUM6-8

Considering the case where M=6, and calculations are to be done in 8 octet hardware, if registerA is 64 bits-long, and bit stringB is 48 bits-long, then the operation RegisterA = SPECIALCOPY6-8 (bit stringB) copies bit stringB to RegisterA as follows:

$$A_{1,y} \leftarrow 0 \qquad y = 1, \ldots, 8$$

$$A_{2,2} \leftarrow B_{1,8}$$
$$A_{2,1} \leftarrow B_{1,7}$$
$$A_{2,y} \leftarrow B_{1,y-2} \qquad y = 3, \ldots, 8$$

$$A_{3,y} \leftarrow B_{1,y} \qquad y = 1, \ldots, 8$$

$$A_{4,2} \leftarrow B_{2,8}$$
$$A_{4,1} \leftarrow B_{2,7}$$
$$A_{4,y} \leftarrow B_{2,y-2} \qquad y = 3, \ldots, 8$$

$$A_{5,1} \leftarrow B_{3,8}$$
$$A_{5,y} \leftarrow B_{3,y-1} \qquad y = 2, \ldots, 8$$

$$A_{6,y} \leftarrow B_{3,y} \qquad y = 1, \ldots, 8$$

$$A_{7,1} \leftarrow B_{4,8}$$
$$A_{7,y} \leftarrow B_{4,y-1} \qquad y = 2, \ldots, 8$$

$$A_{8,y} \leftarrow B_{5,y} \qquad y = 1, \ldots, 8$$

Note that this SPECIALCOPY6-8 process leaves the high order octet of registerA set to zero. This can be used to avoid overflow, as described above.

Process loop specification 20:

For j=1, to F, where F is the number of octet fields of M=6 octets in the checksum scope, Loop:

Inner processing loop 40 and update operation 52 combined:

$$C_1(j) = C_1(j-1) + \text{NUMBER}(\text{SPECIALCOPY6-8}(B_j)) + 6 \times C_0(j-1),$$

$$C_0(j) = C_0(j) = C_0(j-1) + \text{NUMBER}(B_j),$$
$$j = j + 1$$

Evaluation 70:
$$C_0 = \text{VALUEOF}(C_0(j=F))$$
$$C_1 = \text{VALUEOF}(C_1'(j=F) + C_0(j=F))$$

The checksum generation technique may be implemented using customized hardware registers that explicitly designate each octet to be unique. One hardware scheme for keeping the octets in a bit string unique requires that any operations on a given bit string act on each octet in the bit string independently, i.e., the octets do not interact as a result of the operation.

Referring to FIG. 13A, a customized hardware configuration like this, when used in, e.g., an addition operation, keeps any carry bits generated by a particular octet within that octet. For example, with a bit string length specification of M=3 octets, the addition of a bit string, bit stringB, with a register string, RegisterA, is shown in the figure. The addition proceeds as 3 separate, independent mod 255 additions between each of the octets in bit stringB and RegisterA in the following manner. Each of the bit values of the two strings, ranging from the first bit position to the seventh bit position in each octet, are added together, with any carry bit being added to the next most significant bit from the bit that generated the carry. Any carry bit that is generated by the sum of the bits in the eighth bit position of each octet is wrapped around to be added back into the least significant (first) bit of that octet. In this way, the addition operation proceeds as several simultaneous, parallel operations.

This scheme of keeping each octet operation within a string of octets entirely separate may be extended to shifting operations and multiplication operations in a corresponding manner. To explicitly specify these separate operations, the following notation is used. The operation A (+) B represents the result of adding bit string A with bit string B by keeping the octets within the resulting bit string "separate" in the manner described above. The operation A (x) B represents the result of multiplying a scaler number A by bit string B in the same manner.

Alternatively, referring to FIG. 13B, a bit string, e.g., bit stringB, may be added to a register string while keeping any carry generation bits specific to each octet of the bit string using a hardware scheme, like that of FIG. 13B, which specifies one hardware register for each of the additions of the M octets in the bit string. Accordingly, one register, RegisterA1, adds the last octet of bit stringB to its register string, while one register, RegisterA2 adds the second octet of bit stringB to its register string, and one register, RegisterA3, adds the first octet of bit stringB to its register string. Each of the registers must be at least one octet long, but will generally be longer. If the registers are exactly one octet long, then the resulting addition operation is essentially the same as that illustrated in FIG. 13A.

Referring again to FIG. 9B, each of the three registers in FIG. 13B provides, just as the register in FIG. 9B provides, at least one more significant octet than the number of octets being added into the register. These extra octets act to "hold" any carry bits generated by the addition of the bits in the bit string and register string that are in the $8^{th}$ bit position, thereby eliminating overflow of the register string without requiring the carry bit to be wrapped around and added to the least significant bit. As previously discussed, the register strings may be "folded", or the most significant octet may be added back to the least significant octet of the register to allow for more additions to the register without overflowing the register.

Both the addition schemes of FIGS. 13A and 13B provide for the ability to add a bit string to a register string while keeping each of the octet additions independent. The other independent octet operations discussed above could also be completed in such registers.

With these definitions and specialized "separate octet" hardware, a corresponding checksum generation process may be specified. The following bit string specification is used by the operations of this process.

$C_0(j)$ and $C_1(j)$ are defined to be the values of the checksum update variables, with lengths equal to M octets, as required by the customized hardware specification.

Using these definitions, the checksum generation process (FIG. 7) is refined to use "separate octet" hardware as follows:

Process loop specification 20:

For j=1 through F, where F is the number of octet fields of M octets in the checksum scope, Loop:

Inner processing loop 40 and update operation 52 combined:

$$C_1(j) = C_1(j-1) (+) M (X) C_0(j-1),$$

-continued
$$C_0(j) = C_0(j-1) (+) \text{NUMBER}(B_j).$$
$$j = j+1$$
Evaluation 70:
$$D_1(0) = C_1(j=F) (+)$$
$$\text{NUMBER(SHIFT(MASK}(C_0(j=F),$$
$$\text{PATTERN1}(0)),0)),$$

For $i=1$ through p, where $p+1$ is the smallest number of bits required to represent the binary value of M (M=the number of octets per octet field),

```
Loop:
D₁(i) = D₁(i−1) (+)
    NUMBER(SHIFT(MASK(C₀(j=F),
    PATTERN1(i)),i)),
i = i + 1
close loop.
C₁ = VALUEOF(D₁(i=p))
C₀ = VALUEOF(C₀(j=F))
```

The first loop cats to generate the complete value of the variable $C_0$, while generating only a component of the value of the variable $C_1$. $C_1$ is deficient by $[M \times O_{11}) + ((M-1) \times O_{21}) + \ldots + (1 \times O_{M1}) + (-M \times O_{12}) + \ldots + (2 \times O_{(m-1)F}) + (1 \times O_{MF})]$. This amount may be added in to the $C_1$ triangle using the inner process loop computation 42 (FIG. 7) from the basic checksum generation technique process 10 because the bit string comprising $C_0(j=F)$ may be manipulated just as a bit string $B_j$ may be manipulated.

Referring to FIG. 14A, given a process specification of F=3 octet fields of M=3 octets each (a total of 9 octets), upon a first iteration of the first loop, a processor generates a $C_0(j=1)$ rectangle for the first octet field, but sets the $C_1(j=1)$ component to zero. Upon a second iteration of the first loop, a processor generates an $(M (=3) \times C_0(j=1))$ rectangle for $C_1(j=2)$ and a $C_0(j=2)$ rectangle that includes the three octets of the second octet field.

After the third, and last, iteration of the first loop, a processor adds the $C_1(j=2)$ rectangle with $(M \times C_0(j=2))$ rectangle to produce the $C_1(j=3)$ component, and adds octet value blocks for the last three octets of the checksum scope to obtain the complete $C_0(j=3)$.

Referring to FIG. 14D, the $C_1(j=3)$ triangle is deficient from what it should be by the following: M (=3) octet value blocks for the first octet of each octet field, (M−1) octet value blocks for the second octet of each octet field, and 1 octet value block for the last octet of each octet field. The second loop provides the additionally required components of the variable $C_1$ using the exact inner processing loop 42 of the checksum generation technique in FIG. 7.

Other embodiments are within the scope of the claims.

I claim:

1. A method for generating a checksum byte of q electrical bit signals from a sequence of q-bit-signal bytes which collectively form a bit signal string, comprising the computer-implemented steps of:
    segmenting said bit signal string into two or more bit signal groups each including two or more bytes,
    computing a first weighted sum of the bytes of a first and a second bit signal group, wherein, before summing, each byte of said first bit signal group is multiplied by a factor derived from the position of said byte in said first bit signal group, each byte of said second bit signal group is multiplied by a factor derived from the position of said byte in said second bit signal group,
    computing a second unweighted sum of the bytes of said first bit signal group, and then
    computing said checksum byte by multiplying said second sum by the number of bytes in said bit signal groups, and adding the product to said first sum.

2. A method for generating a checksum byte of q electrical bit signals from a sequence of q-bit-signal bytes which collectively form a bit signal string, comprising the computer-implemented steps of:
    segmenting said bit signal string into three or more bit signal groups each including two or more bytes,
    storing an electrical representation of a weighted sum of the bytes of a first bit signal group in a first register, wherein each byte of said first bit signal group is multiplied by a factor derived from the position of said byte in said first bit signal group,
    storing an electrical representation of an unweighted sum of the bytes of said first bit signal group in a second register,
    storing an electrical representation of a zero value in a third register,
    updating the value stored in said first register by adding the value stored in said first register to an electrical representation of a weighted sum of the bytes of a second bit signal group, wherein, before summing, each byte of said second bit signal group is multiplied by a factor derived from the position of said byte in said second bit signal group, and storing an electrical representation of the result in said first register,
    updating the value stored in said third register by adding the value stored in said third register to the value stored in said second register, and storing an electrical representation of the result in said third register, then
    updating the value stored in said second register by adding the value stored in said second register to an electrical representation of the unweighted sum of the byes of said second bit signal group, and storing an electrical representation of the result in said second register;
    repeating said updating steps for a third and further bit signal group until all bit signal groups have been used, and then
    generating said checksum byte by multiplying the value stored in said third register by the number of bytes in said bit signal groups, and adding the product to the value stored in said first register.

3. A method for generating a checksum byte of q electrical bit signals from a sequence of q-bit-signal bytes which collectively form a bit signal string, comprising the computer-implemented steps of:
    segmenting said bit signal string into three or more bit signal groups each including two or more bytes,
    storing the bytes of a first bit signal group in a first register,
    storing an electrical representation of a zero value in a second register,
    updating the value stored in said second register by adding the unweighted sum of the bytes stored in said first register to the value stored in said second register and storing an electrical representation of the result in said second register, then
    updating the value stored in said first register by adding each respective byte stored in said first register to a corresponding byte of a second bit signal group, and storing the result in said first register in place of said respective byte from said first register, repeating said updating steps for a third and further bit signal groups until all bit signal groups have been used, generating a weighted sum of the bytes stored in said first register, wherein, before summing, each byte stored in said first register is multiplied by a factor derived from the position of said byte in said register, generating a product of the value stored in said second register and the number of bytes in said bit signal groups, and generating said checksum byte by adding said weighted sum to said product.

4. The method of claim 1, wherein each weighted sum of the bytes of an input bit signal group is generated via the computer-implemented steps of producing a mask bit signal group of mask bit signals, said mask bit signal group including alternating positive and negative collections of q-bit-signal bytes, wherein every mask bit signal in ever byte of a positive collection has a positive logical value, and every mask bit signal in every byte of a negative collection has a negative value, forming an intermediate bit group of intermediate bit signals, each intermediate bit signal representing the logical AND of an input bit signal holding a given position within said input bit signal group and a mask bit signal holding said given position within said mask bit signal group, said intermediate bit signal holding a position other than said given position within said intermediate bit signal group, repeating said producing and forming steps to form additional intermediate bit signal groups not all of which are identical, and generating the unweighted sum of said intermediate bit signal groups.

5. The method of claim 2, wherein each weighted sum of the bytes of an input bit signal group is generated via the computer-implemented steps of producing a mask bit signal group of mask bit signals, said mask bit signal group including alternating positive and negative collections of q-bit-signal bytes, wherein every mask bit signal in every byte of a positive collection has a positive logical value, and every mask bit signal in every byte of a negative collection has a negative value, forming an intermediate bit group of intermediate bit signals, each intermediate bit signal representing the logical AND of an input bit signal holding a given position within said input bit signal group and a mask bit signal holding said given position within said mask bit signal group, said intermediate bit signal holding a position other than said given position within said intermediate bit signal group, repeating said producing and forming steps to form additional intermediate bit signal groups not all of which are identical, and generating the unweighted sum of said intermediate it signal groups.

6. The method of claim 3, wherein each weighted sum of the bytes of an input bit signal group is generated via the computer-implemented steps of producing a mask bit signal group of mask bit signals, said mask bit signal group including alternating positive and negative collections of q-bit-signal bytes, wherein every mask bit signal in every byte of a positive collection has a positive logical value, and every mask bit signal in every byte of a negative collection has a negative value, forming an intermediate bit group of intermediate bit signals, each intermediate bit signal representing the logical AND of an input bit signal holding a given position within said input bit signal group and a mask bit signal holding said given position within said mask bit signal group, said intermediate bit signal holding a position other than said given position within said intermediate bit signal group, repeating said producing and forming steps to form additional intermediate bit signal groups not all of which are identical, and generating the unweighted sum of said intermediate bit signal groups.

7. The method of claim 4, 5 or 6, wherein:

said input bit signal group includes M bytes, said producing and forming steps are repeated $N+1$ times, where $N+1$ is the smallest number of bits required to represent the binary value of M, the least significant collection of q-bit-signal bytes in said mask bit signal group is a negative collection, and during the $n^{th}$ repetition of said mask bit signal group contains $2^n - 1$ (possibly zero) q-bit-signal bytes, and all other said collections contain $2^n$ q-bit-signal bytes.

8. The method of claim 4, 5 or 6, wherein:

said input bit signal group includes M bytes, where M is a power of 2, said producing and forming steps are repeated B times, where B is the power of 2 corresponding to the value M, the least significant collection of q-bit-signal bytes in said mask bit signal group is a negative collection, and during the $b^{th}$ repetition of said producing step, all said collections contain $2^b$ q-bit-bytes.

9. The method of claim 1, wherein each weighted sum of the bytes of an input bit signal group is generated via the computer-implemented step of:

forming a resultant bit signal group of resultant bit signals, each resultant bit signal having the same logical sate as an input bit signal holding a given position within said input bit signal group, said resultant bit signal holding a position other than said given position within said resultant bit signal group.

10. The method of claim 2, wherein each weighted sum of the bytes of an input bit signal group is generated via the computer-implemented step of:

forming a first resultant bit signal group of first resultant bit signals, each first resultant bit signal having the same logical state as an input bit signal holding a given position within said input bit signal group, said first resultant bit signal holding a position other than said given position within said first resultant bit signal group.

11. The method of claim 3, wherein each weighted sum of the bytes of an input bit signal group is generated via the computer-implemented step of:

forming a first resultant bit signal group of first resultant bit signals, each first resultant bit signal having the same logical state as an input bit signal holding a given position within said input bit signal group, said first resultant bit signal holding a position other than a given position within said first resultant bit signal group.

12. The method of claims 9, 10 or 11, wherein said weighted sum is generated via the further computer-implemented steps of:

forming a second resultant bit signal group of second resultant bit signals, each second resultant bit signal having the same logical state as an input bit signal holding a given position within said input bit group, said second resultant bit signal holding a position other than said given position within said second resultant bit signal group, and generating the unweighted sum of said first and second resultant bit signal groups.

13. The method for generating a weighted sum of a sequence of electrical input bit signals arranged into q-bit-signal bytes and collectively forming an input bit group, comprising the computer-implemented steps of:

producing a mask bit group of mask bit signals, said mask bit group including alternating positive and negative collections of q-bit-signal bytes, wherein every mask bit signal in every byte of a positive collection has a positive logical value, and every mask bit signal in every byte of a negative collection has a negative value, forming an intermediate bit group of intermediate bit signals, each intermediate bit signal representing the logical AND of an input bit signal holding a given position within said input bit group and a mask bit signal holding said given position within said mask bit group, said intermediate bit signal holding a position other than said given position within said intermediate bit group, repeating said producing and forming steps to form additional intermediate bit groups not all of which are identical, and generating said weighted sum by adding said intermediate bit groups.

14. A method for generating a weighted sum of a sequence of electrical input bit signals arranged into q-bit-signal bytes and collectively forming an input bit group, comprising the computer-implementation step of:

forming a resultant bit group of resultant bit signals, each resultant bit signal having the same logical state as an input bit signal holding a given position within said input bit group, said resultant bit signal holding a position other than said given position within said resultant bit group.

15. The method of claim 1, 2, 3 or 11 wherein said bytes are eight bits long and said bit signal groups are sixteen bits long.

16. The method of claim 1, 2, 3 or 11 wherein said bytes are eight bits long and said bit signal groups are thirty-two bits long.

17. The method of claim 1, 2, 3 or 11 wherein said bytes are eight bits long and said bit signal groups are forty-eight bits long.

18. The method of claim 1, 2, 3 or 11 wherein said bytes are eight bits long and said bit signal groups are sixty-four bits long.

19. The method of claim 1, 2, 3 or 11 wherein said bytes are sixteen bits long and said bit signal groups are thirty-two bits long.

20. The method of claim 1, 2, 3 or 11 wherein said bytes are sixteen bits long and said bit signal groups are sixty-four bits long.

21. Apparatus for generating a checksum byte of q electrical bit signals from a sequence of q-bit-signal bytes which collectively form a bit signal string, comprising:

means for segmenting said bit signal string into two or more bit signal groups each including two or more bytes, means for computing a first weighted sum of the bytes of a first and a second bit signal group, wherein, before summing, each byte of said first bit signal group is multiplied by a factor derived from the position of said byte in said first bit signal group, and each byte of said second bit signal group is multiplied by a factor derived from the position of said byte in said second bit signal group, means for computing a second unweighted sum of the bytes of said first bit signal group, and then means for computing said checksum byte by multiplying said second sum by the number of bytes in said bit signal groups, and adding the product to said first sum.

22. Apparatus for generating a checksum byte of q electrical bit signals from a sequence of q-bit-signal bytes which collectively form a bit signal string, comprising:

means for segmenting said bit signal string into three or more bit signal groups each including two or more bytes;

means for storing an electrical representation of a weighted sum of the bytes of a first bit signal group in a first register, wherein each byte of said first bit signal group is multiplied by a factor derived from the position of said byte in said first bit signal group;

means for storing an electrical representation of an unweighted sum of the bytes of said first bit signal group in a second register;

means for storing an electrical representation of a zero value in a third register;

means for updating the value stored in said first register by adding the value stored in said first register to an electrical representation of a weighted sum of the bytes of a second bit signal group, wherein, before summing, each byte of said second bit signal group is multiplied by a factor derived from the position of said byte in said second bit signal group, and storing and electrical representation of the result in said first register, updating the value stored in said third register by adding the value stored in said third register to the value stored in said second register, and storing an electrical representation of the result in said third register, and updating the value stored in said second register by adding the value stored in said second register to an electrical representation of the unweighted sum of the bytes of said second bit signal group, and storing an electrical representation of the result in said second register, and repeating said updating steps for a third and further bit signal group until all bit signal groups have been used; and means for generating said checksum byte by multiplying the value stored in said third register by the number of byte in said bit signal groups, and adding the product to the value stored in said first register.

23. Apparatus for generating a checksum byte of q electrical bit signals form a sequence of q-bit-signal bytes which collectively form a bit signal string, comprising:

means for segmenting said bit signal string into three or more bit signal groups each including two or more bytes, means for storing the bytes of a first bit signal group in a first register, means for storing an electrical representation of a zero value in a second register, means for updating the value stored in said second register by adding the unweighted sum of the bytes stored in said first register to the value stored in said second register and storing an electrical representation of the result in said second register, then updating the value stored in said first register by adding each respective byte stored in said first register to a corresponding byte of a second bit signal group, and storing the result in said first register in place of said respective byte from said first register, and repeating said updating steps for a third and further bit signal groups unit all bit signal groups have been used, means for generating a weighted sum of the bytes stored in said first register, wherein, before summing, each byte stored in said first register is multiplied by a factor derived from the position of said byte in said register, means for generating a product of the value stored in said second register and the number of bytes in said bit signal groups, and means for generating said checksum byte by adding said weighted sum to said product.

24. Apparatus for generating a weighted sum of a sequence of electrical input bit signals arranged into q-bit-signal bytes and collectively forming an input bit group, comprising:

means for producing a mask bit group of mask bit signals, said mask bit group including alternating positive and negative collections of q-bit-signal bytes, wherein every mask bit signal in every byte of a positive collection has a positive logical value, and every mask bit signal in every byte of a negative collection has a negative value, means for forming an intermediate bit group of intermediate bit signals, each intermediate bit signal representing the logical AND of an input bit signal holding a given position within said input bit group and a mask bit signal holding said given position within said mask bit group, said intermediate bit signal holding a position other than said given position within said intermediate bit group, wherein said producing and forming means generates multiple intermediate bit groups not all of which are identical, and further comprising means for generating said weighted sum by adding said intermediate bit groups.

25. Apparatus for generating a weighted sum of a sequence of electrical input bit signals arranged into q-bit-signal bytes and collectively forming an input bit group, comprising:

means for storing said input bit signals in an initial order, and means for forming a resultant bit group of resultant bit signals, each resultant bit signal having the same logical state as an input bit signal holding a given position in said initial order, said resultant bit signal holding a position other than said given position within said resultant bit group.

26. The method of claim 12 wherein said bytes are eight bits long and said bit signal groups are sixteen bits long.

27. The method of claim 12 wherein said bytes are eight bits long and said bit signal groups are thirty-two bits long.

28. The method of claim 12 wherein said bytes are eight bits long and said bit signal groups are forty-eight bits long.

29. The method of claim 12 wherein said bytes are eight bits long and said bit signal groups are sixty-four bits long.

30. The method of claim 12 wherein said bytes are sixteen bits long and said bit signal groups are thirty-two bits long.

31. The method of claim 12 wherein said bytes are sixteen bits long and said bit signal groups are sixty-four bits long.

* * * * *

UNITED STATES PATENT AND TRADEMARK OFFICE
CERTIFICATE OF CORRECTION

PATENT NO. : 5,247,524

DATED : September 21, 1993

INVENTOR(S) : Ross Callon

It is certified that error appears in the above-identified patent and that said Letters Patent is hereby corrected as shown below:

On the title page:
In the References Cited, Other Publications section, "Skiower" should be --Sklower--.

Col. 2, line 10, "$2^q$" should be --$2^1$--.

Col. 3, line 43, "equa]" should be --equal--.

Col. 4, line 1, "$2^p-1$" should be --$2^q-1$--.

Col. 5, line 32, "$(2^q 1)$" should be --$(2^q-1)$--.

Col. 5, line 37, "it" should be --bit--.

Col. 7, line 4, after "process" insert --loop--.

Col. 7, line 5, after "technique" insert --of--.

Col. 7, line 11, after "13B" insert --is--.

Col. 7, line 15, after "for" insert --implementing--.

Col. 7, line 24, after "14D" insert --is--.

Col. 7, line 47, "Octet" should be --octet--.

Col. 8, line 17, "$(2^2)$" should be --$(2^0)$--.

Col. 10, line 23, "$w^3$" should be --$2^3$,--.

Col. 10, line 52, "$2^9=2^q=2$" should be --$2^i=2^1=2$--.

UNITED STATES PATENT AND TRADEMARK OFFICE
CERTIFICATE OF CORRECTION

PATENT NO. : 5,247,524

DATED : September 21, 1993

INVENTOR(S) : Ross Callon

It is certified that error appears in the above-identified patent and that said Letters Patent is hereby corrected as shown below:

Col. 11, line 13, "loop,.the" should be --loop, the--.

Col. 12, line 5, "With" should be --with--.

Col. 12, line 20, "SHIFT(MASK(B, PATTERN1 0)), 0)" should be --SHIFT(MASK($B_j$, PATTERN1 0)), 0)--.

Col. 12, line 48, "B" should be --$B_j$--.

Col. 13, line 50, "$C_1$(j=F)" should be --$C_1'$(j=F)--.

Col. 13, line 67, "Operations" should be --operation--.

Col. 14, line 22, "With" should be --with--.

Col. 14, line 46, "left -most" should be --left-most--.

Col. 15, line 14, "010010010010010" should be --1010010010010010--.

Col. 15, line 26, "i" should be --1.--.

Col. 17, line 5, "Value" should be --value--.

Col. 17, line 17, "$2^i=2^q32$ 2" should be --$2^i=2^1=2$--.

Col. 18, line 8, after "Register A." insert --$A_{x,y}$--.

Col. 19, line 15, delete "lo".

Col. 21, line 10, "j=b1" should be --j=1--.

UNITED STATES PATENT AND TRADEMARK OFFICE
CERTIFICATE OF CORRECTION

PATENT NO. : 5,247,524

DATED : September 21, 1993

INVENTOR(S) : Ross Callon

It is certified that error appears in the above-identified patent and that said Letters Patent is hereby corrected as shown below:

Col. 21, lines 10-11, delete "where F is the number of octet fields of M=1 through F,".

Col. 22, line 3, "$C_o(j) = C_o(i-1)$" should be --$C_0(j) - C_0j-1)$--.

Col. 22, line 11, "the" should be --then--.

Col. 22, line 59, "copes" should be --copies--.

Col. 24, line 13, "$A_{15,y}$" should be --$A_{15,1}$--.

Col. 24, line 60, after "Loop:" insert --Inner processing loop 40 and update operation 52:--.

Col. 25, line 11, " "$th$" " should be --$yth$--.

Col. 29, line 20, "cats" should be --acts--.

Col. 29, claim 1, line    after "group," insert --and--.

Col. 30, claim 2, line 42, "byes" should be --bytes--.

Col. 31, claim 4, line 24, "ever" should be --every--.

Col. 31, claim 5, line 62, "it" should be --bit--.

Col. 32, claim 7, line 27, after "said" insert --producing steps, the least significant collection of said--.

UNITED STATES PATENT AND TRADEMARK OFFICE
CERTIFICATE OF CORRECTION

PATENT NO. : 5,247,524

DATED : September 21, 1993

INVENTOR(S) : Ross Callon

It is certified that error appears in the above-identified patent and that said Letters Patent is hereby corrected as shown below:

Col. 32, claim 9, line 47, "sate" should be --state--.

Col. 33, claim 11,, line 2, "a" should be --said--.

Col. 34, claim 22, line 55, "and" should be --then--.

Col. 34, claim 22, line 67, "byte" should be --bytes--.

Col. 35, claim 23, line 2, "form" should be --from--.

Col. 36, claim 24, line 11, "generates" should be --generate--.

Signed and Sealed this

Fourth Day of July, 1995

Attest:

BRUCE LEHMAN

*Attesting Officer*      *Commissioner of Patents and Trademarks*